United States Patent
Cadugan et al.

(10) Patent No.: US 10,921,391 B2
(45) Date of Patent: Feb. 16, 2021

(54) MAGNETIC FIELD SENSOR WITH SPACER

(71) Applicant: Allegro MicroSystems, LLC, Manchester, NH (US)

(72) Inventors: Bryan Cadugan, Bedford, NH (US); William P. Taylor, Amherst, NH (US)

(73) Assignee: Allegro MicroSystems, LLC, Manchester, NH (US)

( * ) Notice: Subject to any disclaimer, the term of this patent is extended or adjusted under 35 U.S.C. 154(b) by 23 days.

(21) Appl. No.: 16/527,319

(22) Filed: Jul. 31, 2019

(65) Prior Publication Data

US 2020/0041583 A1  Feb. 6, 2020

Related U.S. Application Data

(60) Provisional application No. 62/714,951, filed on Aug. 6, 2018.

(51) Int. Cl.
*G01R 33/02* (2006.01)
*G01R 33/07* (2006.01)
(Continued)

(52) U.S. Cl.
CPC ......... *G01R 33/072* (2013.01); *G01R 33/091* (2013.01); *H01L 43/02* (2013.01)

(58) Field of Classification Search
CPC .......... G01D 5/145; G01D 5/147; G01D 5/12; G01D 5/14; G01D 5/16; G01D 5/165;
(Continued)

(56) References Cited

U.S. PATENT DOCUMENTS 3,195,043 A   7/1965 Burig et al.
3,281,628 A   10/1966 Bauer et al.
(Continued)

FOREIGN PATENT DOCUMENTS

CH   683 469 A5   3/1994
DE   103 14 602 A1   10/2004
(Continued)

OTHER PUBLICATIONS

Allegro MicroSystems, Inc., "Gear-Tooth Sensor for Automotive Applications;" Aug. 3, 2001; 2 Pages.
(Continued)

*Primary Examiner* — Thang X Le
(74) *Attorney, Agent, or Firm* — Daly Crowley Mofford & Durkee, LLP

(57) ABSTRACT

Methods and apparatus for a magnetic field sensor integrated circuit including a lead frame having a first surface, a second opposing surface, and a plurality of leads. A substrate has a first surface supporting a magnetic field sensing element and a second surface attached to the first surface of the lead frame. A magnet has a first surface and a second, opposing surface, and is configured to generate a magnetic field. A spacer is positioned between the first surface of the magnet and the second surface of the lead frame with a thickness selected to establish a predetermined distance between the first surface of the magnet and the magnetic field sensing element, the predetermined distance selected to provide the magnetic field signal as a sinusoidal signal.

23 Claims, 23 Drawing Sheets

(51) Int. Cl.
*H01L 43/02* (2006.01)
*G01R 33/09* (2006.01)

(58) Field of Classification Search
CPC .. G01D 5/2457; G01D 5/2013; G01D 5/2046; G01D 5/24476; G01D 5/245; G01R 33/072; G01R 33/025; G01R 33/07; G01R 33/0206; G01R 33/06; G01R 33/063; G01R 33/09; G01R 33/091; G01R 33/093; G01R 33/0052; G01R 33/0094; G01R 33/18; G01N 27/9033; G01N 27/902; G01N 27/9013; G01N 27/904; G01N 27/223; G01N 27/82; G01N 27/9093
See application file for complete search history.

(56) References Cited

U.S. PATENT DOCUMENTS

| | | | |
|---|---|---|---|
| 3,627,901 A | 12/1971 | Happ | |
| 3,661,061 A | 5/1972 | Tokarz | |
| 4,048,670 A | 9/1977 | Eysermans | |
| 4,188,605 A | 2/1980 | Stout | |
| 4,204,317 A | 5/1980 | Winn | |
| 4,283,643 A | 8/1981 | Levin | |
| 4,315,523 A | 2/1982 | Mahawili et al. | |
| 4,614,111 A | 9/1986 | Wolff | |
| 4,733,455 A | 3/1988 | Nakamura et al. | |
| 4,746,859 A | 5/1988 | Malik | |
| 4,769,344 A | 9/1988 | Sakai et al. | |
| 4,772,929 A | 9/1988 | Manchester | |
| 4,908,685 A | 3/1990 | Shibasaki et al. | |
| 4,935,698 A | 6/1990 | Kawaji et al. | |
| 5,010,263 A | 4/1991 | Murata | |
| 5,021,493 A | 6/1991 | Sandstrom | |
| 5,028,868 A | 7/1991 | Murata et al. | |
| 5,045,920 A | 9/1991 | Vig et al. | |
| 5,068,712 A | 11/1991 | Murakami et al. | |
| 5,084,289 A | 1/1992 | Shin et al. | |
| 5,121,289 A | 6/1992 | Gagliardi | |
| 5,137,677 A | 8/1992 | Murata | |
| 5,196,794 A | 3/1993 | Murata | |
| 5,210,493 A | 5/1993 | Schroeder et al. | |
| 5,216,405 A | 6/1993 | Schroeder et al. | |
| 5,247,202 A | 9/1993 | Popovic et al. | |
| 5,250,925 A | 10/1993 | Shinkle | |
| 5,315,245 A | 5/1994 | Schroeder et al. | |
| 5,414,355 A | 5/1995 | Davidson et al. | |
| 5,434,105 A | 7/1995 | Liou | |
| 5,453,727 A | 9/1995 | Shibasaki et al. | |
| 5,488,294 A | 1/1996 | Liddell et al. | |
| 5,491,633 A | 2/1996 | Henry et al. | |
| 5,500,589 A | 3/1996 | Sumcad | |
| 5,508,611 A | 4/1996 | Schroeder et al. | |
| 5,581,170 A | 12/1996 | Mammano et al. | |
| 5,581,179 A | 12/1996 | Engel et al. | |
| 5,627,315 A | 5/1997 | Figi et al. | |
| 5,631,557 A | 5/1997 | Davidson | |
| 5,712,562 A | 1/1998 | Berg | |
| 5,719,496 A | 2/1998 | Wolf | |
| 5,781,005 A | 7/1998 | Vig et al. | |
| 5,818,222 A | 10/1998 | Ramsden | |
| 5,883,567 A | 3/1999 | Mullins, Jr. | |
| 5,891,377 A | 4/1999 | Libres et al. | |
| 5,912,556 A | 6/1999 | Frazee et al. | |
| 5,963,028 A | 10/1999 | Engel et al. | |
| 6,016,055 A | 1/2000 | Jäger et al. | |
| 6,175,233 B1 | 1/2001 | McCurley et al. | |
| 6,184,679 B1 | 2/2001 | Popovic et al. | |
| 6,265,865 B1 | 7/2001 | Engel et al. | |
| 6,278,269 B1 | 8/2001 | Vig et al. | |
| 6,356,068 B1 | 3/2002 | Steiner et al. | |
| 6,452,381 B1 | 9/2002 | Nakatani et al. | |
| 6,545,332 B2 | 4/2003 | Huang | |
| 6,545,457 B2 | 4/2003 | Goto et al. | |
| 6,545,462 B2 | 4/2003 | Schott et al. | |
| 6,683,452 B2 | 1/2004 | Lee et al. | |
| 6,692,676 B1 | 2/2004 | Vig et al. | |
| 6,714,003 B2 | 3/2004 | Babin | |
| 6,770,163 B1 | 8/2004 | Kuah et al. | |
| 6,781,359 B2 | 8/2004 | Stauth et al. | |
| 6,798,193 B2 | 9/2004 | Zimmerman et al. | |
| 7,193,412 B2 | 3/2007 | Freeman | |
| 7,265,531 B2 | 9/2007 | Stauth et al. | |
| 7,285,952 B1 | 10/2007 | Hatanaka et al. | |
| 7,323,870 B2 | 1/2008 | Tatschl et al. | |
| 7,355,388 B2 | 4/2008 | Ishio | |
| 7,358,724 B2 | 4/2008 | Taylor et al. | |
| 7,385,394 B2 | 6/2008 | Auberger et al. | |
| 7,476,953 B2 | 1/2009 | Taylor et al. | |
| 7,714,570 B2 | 5/2010 | Thomas et al. | |
| 7,768,083 B2 | 8/2010 | Doogue et al. | |
| 7,816,772 B2 | 10/2010 | Engel et al. | |
| 8,022,692 B2 | 9/2011 | Fernandez et al. | |
| 8,143,169 B2 | 3/2012 | Engel et al. | |
| 8,461,677 B2 | 6/2013 | Ararao et al. | |
| 8,486,755 B2 | 7/2013 | Ararao et al. | |
| 8,629,539 B2 | 1/2014 | Milano et al. | |
| 9,664,497 B2 | 5/2017 | Kerdraon et al. | |
| 9,869,566 B2 | 1/2018 | Tima et al. | |
| 2001/0030537 A1 | 10/2001 | Honkura et al. | |
| 2002/0195693 A1 | 12/2002 | Liu et al. | |
| 2003/0222642 A1 | 12/2003 | Butzmann | |
| 2004/0032251 A1 | 2/2004 | Zimmerman et al. | |
| 2004/0046248 A1 | 3/2004 | Waelti et al. | |
| 2004/0080314 A1 | 4/2004 | Tsujii et al. | |
| 2004/0145043 A1 | 7/2004 | Hayashi et al. | |
| 2004/0155644 A1 | 8/2004 | Stauth et al. | |
| 2004/0184196 A1 | 9/2004 | Jayasekara | |
| 2004/0207398 A1 | 10/2004 | Kudo et al. | |
| 2005/0167790 A1 | 8/2005 | Khor et al. | |
| 2005/0236698 A1 | 10/2005 | Ozawa et al. | |
| 2005/0280411 A1 | 12/2005 | Bicking | |
| 2006/0033487 A1 | 2/2006 | Nagano et al. | |
| 2006/0038560 A1 | 2/2006 | Kurumado | |
| 2006/0068237 A1 | 3/2006 | Murphy et al. | |
| 2006/0072249 A1 | 4/2006 | Wakui et al. | |
| 2006/0152210 A1 | 7/2006 | Mangtani et al. | |
| 2006/0175674 A1 | 8/2006 | Taylor et al. | |
| 2006/0181263 A1 | 8/2006 | Doogue et al. | |
| 2006/0238190 A1 | 10/2006 | Ishio | |
| 2006/0261801 A1 | 11/2006 | Busch | |
| 2007/0018642 A1* | 1/2007 | Ao | G01D 11/245 324/252 |
| 2007/0170533 A1 | 7/2007 | Doogue et al. | |
| 2008/0013298 A1 | 1/2008 | Sharma et al. | |
| 2008/0184799 A1* | 8/2008 | Phan Le | G01P 15/11 73/514.31 |
| 2008/0237818 A1 | 10/2008 | Engel et al. | |
| 2009/0140725 A1 | 6/2009 | Ausserlechner | |
| 2010/0141249 A1 | 6/2010 | Ararao et al. | |
| 2010/0188078 A1 | 7/2010 | Foletto | |
| 2010/0201356 A1 | 8/2010 | Koller et al. | |
| 2010/0237450 A1 | 9/2010 | Doogue et al. | |
| 2010/0276769 A1 | 11/2010 | Theuss et al. | |
| 2010/0295140 A1 | 11/2010 | Theuss et al. | |
| 2011/0050222 A1 | 3/2011 | Ueno et al. | |
| 2011/0127998 A1 | 6/2011 | Elian et al. | |
| 2011/0133732 A1 | 6/2011 | Sauber | |
| 2011/0175598 A1 | 7/2011 | Doering et al. | |
| 2012/0086090 A1 | 4/2012 | Sharma et al. | |
| 2014/0266179 A1* | 9/2014 | Ausserlechner | G01R 33/09 324/244 |
| 2016/0334830 A1* | 11/2016 | Sirohiwala | G05G 1/04 |
| 2018/0017412 A1 | 1/2018 | Eagen et al. | |
| 2019/0204063 A1* | 7/2019 | Ausserlechner | G01D 5/16 |

FOREIGN PATENT DOCUMENTS

| | | |
|---|---|---|
| DE | 10 2004 060 298 A1 | 6/2006 |
| DE | 10 2007 018 238 A1 | 10/2008 |
| DE | 10 2008 064047 A1 | 4/2010 |
| DE | 10 2009 000 460 A1 | 7/2010 |
| EP | 0 361 456 A2 | 4/1990 |

(56) References Cited

FOREIGN PATENT DOCUMENTS

| | | |
|---|---|---|
| EP | 0 409 173 A2 | 1/1991 |
| EP | 0 680 103 B1 | 2/2000 |
| EP | 1 160 887 A2 | 12/2001 |
| EP | 1 443 332 A1 | 8/2004 |
| EP | 0 898 180 B1 | 11/2004 |
| EP | 2 366 976 A1 | 9/2011 |
| FR | 2 748 105 A1 | 10/1997 |
| JP | 63 84176 A | 4/1988 |
| JP | 63-263782 | 10/1988 |
| JP | 04-152688 | 5/1992 |
| JP | 04-357858 A | 12/1992 |
| JP | 08-097486 | 4/1996 |
| JP | H08-264569 A | 10/1996 |
| JP | 09-166612 | 6/1997 |
| JP | 11 074142 A | 3/1999 |
| JP | 2000-183241 A | 6/2000 |
| JP | 2000-294692 | 10/2000 |
| JP | 2001-116815 | 4/2001 |
| JP | 2001-141738 A | 5/2001 |
| JP | 2001-165702 | 6/2001 |
| JP | 2003-177171 | 6/2003 |
| JP | 2004-055932 A | 2/2004 |
| JP | 2004-356338 | 12/2004 |
| JP | 2005-345302 | 12/2005 |
| JP | 2007-218799 | 8/2007 |
| WO | WO 99/014605 A1 | 3/1999 |
| WO | WO 03/107018 A1 | 12/2003 |
| WO | WO 2004/027436 | 4/2004 |
| WO | WO 2006/037695 | 4/2006 |
| WO | WO 2006/083479 | 8/2006 |
| WO | WO 2008/008140 A2 | 1/2008 |
| WO | WO 2008/121443 A1 | 10/2008 |
| WO | WO 2010/065315 | 6/2010 |
| WO | WO 2013/109355 | 7/2013 |
| WO | WO 2013/141981 | 9/2013 |
| WO | WO 2013/142112 | 9/2013 |

OTHER PUBLICATIONS

Allegro MicroSystems, Inc., "Hall-Effect IC Applications Guide;" Retrieved from: http://www.allegromicro.com/en/Products/Design/an/an27701.pdf; Jan. 1997; 36 Pages.

Allegro MicroSystems, Inc., "True Zero-Speed Low-Jitter High Accuracy Gear Tooth Sensor;" ATS625LSG; Jan. 2005; 21 Pages.

Allegro MicroSystems, Inc., "Two-Wire True Zero Speed Miniature Differential Peak-Detecting Gear Tooth Sensor;" ATS645LSH; Jan. 2004; 14 Pages.

Dwyer, "Back-Biased Packaging Advances (SE, SG & SH versus SA & SB)," http://www.allegromicro.com/en/Products/Design/packaging_advances/index.asp, Jan. 2008; 6 Pages.

Honeywell International, Inc., "Hall Effect Sensing and Application," Micro Switch Sensing and Control, Chapter 3, http://content.honeywell.com/sensing/prodinfo/solidstate/technical/hallbook.pdf, date unavailable but believed to be before Jan. 2008, pp. 9-18; 10 Pages.

Johnson et al., "Hybrid Hall Effect Device," Appl. Phys. Lett., vol. 71, No. 7; Aug. 1997; pp. 974-976; 3 Pages.

Lagorce et al., "Magnetic and Mechanical Properties of Micromachined Strontium Ferrite/Polyimide Composites," Journal of Microelectromechanical Systems, vol. 6, No. 4; Dec. 1997; pp. 307-312; 6 Pages.

Lequesne et al., "High-Accuracy Magnetic Position Encoder Concept," IEEE Transactions on Industry Applications, vol. 35, No. 3, May/Jun. 1999; pp. 568-576; 9 Pages.

Melexis Microelectronic Systems, Hall Applications Guide, Section 3—Applications, Jan. 1997; 48 Pages.

Park et al., "Ferrite-Based Integrated Planar Inductors and Transformers Fabricated at Low Temperature," IEEE Transactions on Magnetics, vol. 33, No. 5; Sep. 1997; pp. 3322-3324; 3 Pages.

Response (with Amended Claims) to Extended European Search Report dated Jan. 13, 2020 for European Application No. 19190386.3; Response Filed Aug. 11, 2020; 26 Pages.

European Extended Search Report dated Jan. 13, 2020 for European Application No. 19190386.3; 6 Pages.

\* cited by examiner

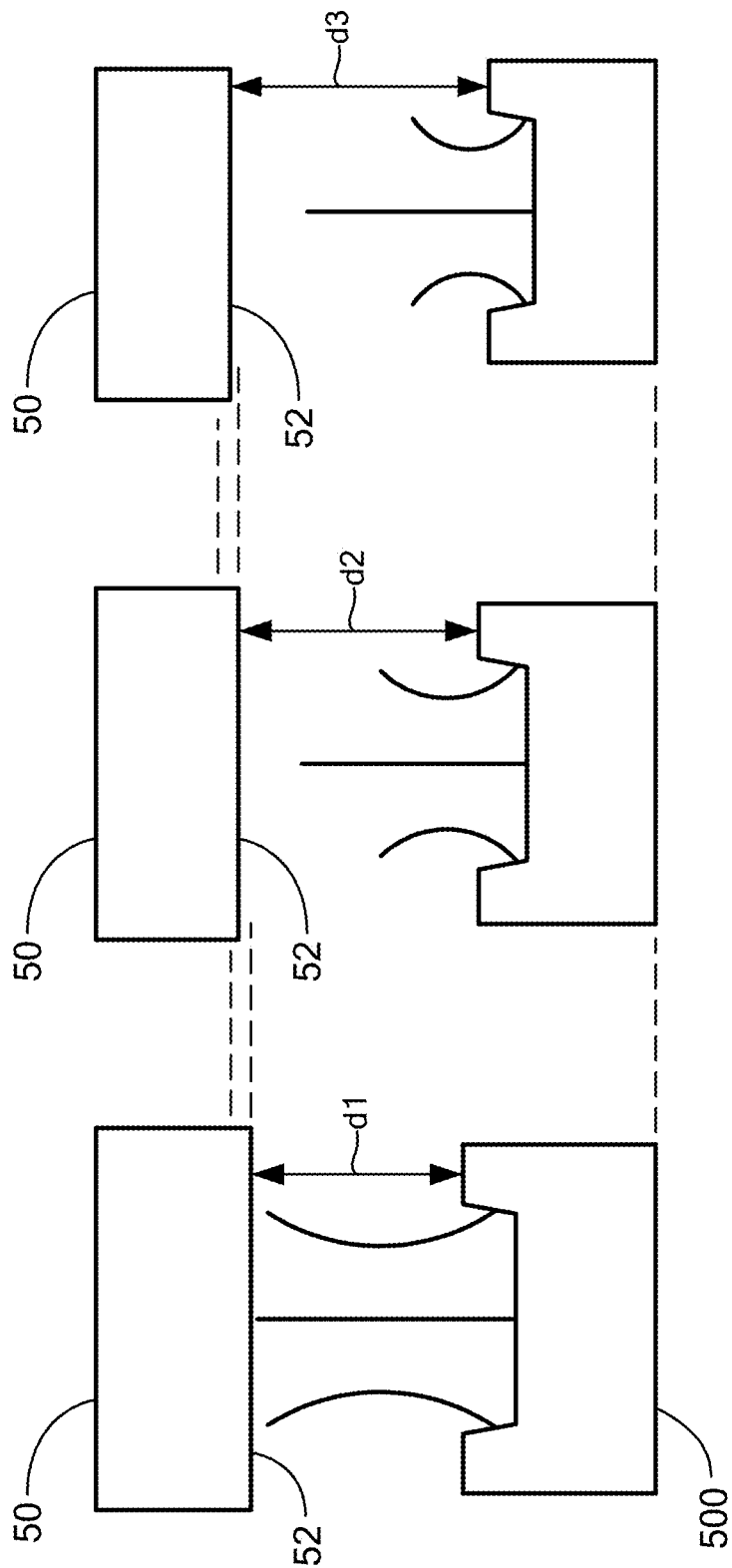

MAGNETIC FIELD SENSOR WITH SPACER

CROSS REFERENCE TO RELATED APPLICATIONS

The present application claims the benefit of U.S. Provisional Patent Application No. 62/714,951, filed on Aug. 6, 2018, which is incorporated herein by reference.

BACKGROUND

Various types of magnetic field sensing elements are known, including Hall Effect elements and magnetoresistance (MR) elements. Magnetic field sensors generally include a magnetic field sensing element and other electronic components. Some magnetic field sensors also include a permanent magnet (a hard ferromagnetic object) in a so-called "back biased" arrangement.

Magnetic field sensors provide an electrical signal representative of a sensed magnetic field. In some embodiments that have a back-bias magnet, the sensed magnetic field is a magnetic field generated by the magnet, in which case, in the presence of a moving ferromagnetic object, the magnetic field generated by the magnet and sensed by the magnetic field sensor varies in accordance with a shape or profile of the moving ferromagnetic object. In contrast, magnetic field sensors that sense a moving magnet directly sense variations of magnetic field magnitude and direction that result from movement of the magnet.

SUMMARY

Embodiments provide a back-biased magnetic field sensor with immunity to common mode fields. The sensor can include magnetoresistive sensing elements, which can be arranged in a bridge configuration, for sensing a ferromagnetic target at first and second orientations. In a first mode, the magnetic sensor is positioned in a first orientation so that a sensitive direction of the sensing elements is along a direction of a target, such as a gear tooth. In a second mode, the magnetic sensor is positioned in a second orientation to sense the variation of the divergence of the magnetic flux lines coming from the back biasing magnet.

In one aspect, a magnetic field sensor for measuring movement of a target, the magnetic field sensor comprising: a substrate having a first and second surfaces; a magnet disposed proximate to the first surface, wherein the magnet includes at least two poles to generate a magnetic field; and a first bridge structure having a first plurality of magnetic field sensing elements configured to generate a first magnetic field signal indicative of a position of the target and a second plurality of magnetic field sensing elements configured to generate a second magnetic field signal indicative of the position of the target, wherein a first pair of magnetic field sensing elements of the first plurality of magnetic field sensing elements are spaced a first distance from each other and a second pair of magnetic field sensing elements of the second plurality of magnetic field sensing elements are spaced a second, distance from each other, wherein an axis of sensitivity of the first and second pluralities of magnetic field sensing elements is rotated at a predetermined angle with respect to an axis of rotation of the target, and wherein the first bridge structure is configured to generate an output signal based on the first magnetic field signal and the second magnetic field signal, the output signal corresponding to the position of the target and a change in a property of the magnetic field generated by the magnet.

A magnetic field sensor can include one or more of the following features: first and second magnetic field sensing elements of the first plurality of magnetic field sensing elements are spaced equidistant from a first center axis of the magnet, first and second magnetic field sensing elements of the second plurality of magnetic field sensing elements are spaced equidistant from a first center axis of the magnet, the first distance between first pair of magnetic field sensing elements of the first plurality of magnetic field sensing elements is less than the second distance between second pair of magnetic field sensing elements of the second plurality of magnetic field sensing elements, first and second magnetic field sensing elements of the first plurality of magnetic field sensing elements are spaced equidistant from a first center axis of the magnet and third and fourth magnetic field sensing elements of the first plurality of magnetic field sensing elements are spaced equidistant from the first center axis of the magnet, and wherein the first and third magnetic field sensing elements are spaced equidistant from a second center axis of the magnet and the second and fourth magnetic field sensing elements are spaced equidistant from the second center axis of the magnet, first and second magnetic field sensing elements of the second plurality of magnetic field sensing elements are spaced equidistant from a first center axis of the magnet and third and fourth magnetic field sensing elements of the second plurality of magnetic field sensing elements are spaced equidistant from the first center axis of the magnet, and wherein the first and third magnetic field sensing elements are spaced equidistant from a second center axis of the magnet and the second and fourth magnetic field sensing elements are spaced equidistant from the second center axis of the magnet, a second bridge structure having a third plurality of magnetic field sensing elements and a fourth plurality of magnetic field sensing elements, wherein a first pair of magnetic field sensing elements of the third plurality of magnetic field sensing elements are spaced a first distance from each other and a second pair of magnetic field sensing elements of the fourth plurality of magnetic field sensing elements are spaced a second, different distance from each other, the first magnetic field signal corresponds to a first degree of contraction of the magnetic field generated by the magnet in response to the position of the target and the second magnetic field signal corresponds to a second, different degree of contraction of the magnet field generated by the magnet in response to the position of the target, a circuit coupled to the first bridge structure, wherein the circuit comprises a comparison device having a first input coupled to a first output of the first bridge structure to receive the first magnetic field signal and a second input coupled to a second output of the first bridge structure to receive the second magnetic field signal, the circuit further comprises an offset module coupled to the first and second outputs of the first bridge structure, wherein the offset module is configured to provide an offset adjustment to the first and second magnetic field signals, the circuit further comprises a converter module having an input coupled to the output of the comparison device, the axis of sensitivity of the first and second plurality of magnetic field sensing elements is perpendicular to the axis of rotation of the target, the predetermined angle ranges from about 0 degrees with respect to the axis of rotation of the target to about 90 degrees with respect to the axis of rotation of the target, the first plurality of magnetic field sensing elements comprises a first plurality of magnetoresistance elements and the second plurality of magnetic field sensing elements comprises a second plurality of magnetoresistance elements, and/or the first and second pluralities of magnetoresistance elements comprise one or more of giant magnetoresistance (GMR) elements, anisotropic magnetoresistance (AMR) elements, tunneling magnetoresistance (TMR) elements or magnetic tunnel junction (MTJ) elements.

In another aspect, a method for measuring movement of a target, the method comprises: positioning a magnetic field sensor relative to the target, wherein the magnetic field sensor includes: a substrate having a first and second surfaces; a magnet disposed proximate to the first surface, wherein the magnet includes at least two poles to generate a magnetic field; and a first bridge structure having first and second pluralities of magnetic field sensing elements, wherein a first pair of magnetic field sensing elements of the first plurality of magnetic field sensing elements are spaced a first distance from each other and a second pair of magnetic field sensing elements of the second plurality of magnetic field sensing elements are spaced a second, distance from each other, and wherein an axis of sensitivity of first and second pluralities of magnetic field sensing elements is rotated at a predetermined angle with respect to an axis of rotation of the target; and generating a first magnetic field signal indicative by the first plurality of magnetic field sensing elements, wherein the first magnetic field structure is indicative of a position of the target; generating a second magnetic field signal by the second plurality of magnetic field sensing elements, wherein the second magnetic field signal indicative of the position of the target; generating an output signal based on the first magnetic field signal and the second magnetic field signal, wherein the output signal corresponds to the position of the target and a change in a property of the magnetic field generated by the magnet.

A method can further include one or more of the following features: spacing first and second magnetic field sensing elements of the first plurality of magnetic field sensing elements equidistant from a first center axis of the magnet, spacing first and second magnetic field sensing elements of the second plurality of magnetic field sensing elements equidistant from a first center axis of the magnet, the first distance between the first pair of magnetic field sensing elements of the first plurality of magnetic field sensing elements is less than the second distance between the second pair of magnetic field sensing elements of the second plurality of magnetic field sensing elements, first and second magnetic field sensing elements of the first plurality of magnetic field sensing elements are spaced equidistant from a first center axis of the magnet and third and fourth magnetic field sensing elements of the first plurality of magnetic field sensing elements are spaced equidistant from the first center axis of the magnet, and wherein the first and third magnetic field sensing elements are spaced equidistant from a second center axis of the magnet and the second and fourth magnetic field sensing elements are spaced equidistant from the second center axis of the magnet, first and second magnetic field sensing elements of the second plurality of magnetic field sensing elements are spaced equidistant from a first center axis of the magnet and third and fourth magnetic field sensing elements of the second plurality of magnetic field sensing elements are spaced equidistant from the first center axis of the magnet, and wherein the first and third magnetic field sensing elements are spaced equidistant from a second center axis of the magnet and the second and fourth magnetic field sensing elements are spaced equidistant from the second center axis of the magnet, the magnetic field sensor comprises a second bridge structure having a third plurality of magnetic field sensing elements and a fourth plurality of magnetic field sensing elements, wherein a first pair of magnetic field sensing elements of the third plurality of magnetic field sensing elements are spaced a first distance from each other and a second pair of magnetic field sensing elements of the fourth plurality of magnetic field sensing elements are spaced a second, different distance from each other, the first magnetic field signal corresponds to a first degree of contraction of the magnetic field generated by the magnet in response to the position of the target and the second magnetic field signal corresponds to a second, different degree of contraction of the magnet field generated by the magnet in response to the position of the target, the magnetic field sensor further comprises a circuit coupled to the first bridge structure, wherein the circuit comprises a comparison device having a first input coupled to a first output of the first bridge structure to receive the first magnetic field signal and a second input coupled to a second output of the first bridge structure to receive the second magnetic field signal, providing an offset adjustment, by an offset module, the first and second magnetic field signals, converting a comparison signal generated by the comparison device from an analog signal to a digital signal, the axis of sensitivity of the first and second plurality of magnetic field sensing elements is perpendicular to the axis of rotation of the target, the predetermined angle ranges from about 0 degrees with respect to the axis of rotation of the target to about 90 degrees with respect to the axis of rotation of the target, the first plurality of magnetic field sensing elements comprises a first plurality of magnetoresistance elements and the second plurality of magnetic field sensing elements comprises a second plurality of magnetoresistance elements, and/or the first and second pluralities of magnetoresistance elements comprise one or more of giant magnetoresistance (GMR) elements, anisotropic magnetoresistance (AMR) elements, tunneling magnetoresistance (TMR) elements or magnetic tunnel junction (MTJ) elements.

In another aspect, a magnetic field sensor for measuring movement of a target, the magnetic field sensor comprises: a substrate having a first and second surfaces; a means for generating a magnetic field disposed proximate to the first surface, wherein the means for generating includes at least two poles; and a first sensing means having a first plurality of magnetic field sensing means configured to generate a first magnetic field signal indicative of a position of the target and a second plurality of magnetic field sensing means configured to generate a second magnetic field signal indicative of the position of the target, wherein a first pair of magnetic field sensing means of the first plurality of magnetic field sensing means are spaced a first distance from each other and a second pair of magnetic field sensing means of the second plurality of magnetic field sensing means are spaced a second, different distance from each other; wherein an axis of sensitivity of the first and second pluralities of magnetic field sensing means is rotated at a predetermined angle with respect to an axis of rotation of the target, and wherein the first sensing means is configured to generate an output signal based on the first magnetic field signal and the second magnetic field signal, the output signal corresponding to the position of the target and a change in a property of the magnetic field generated by the means for generating.

A magnetic field sensor can further include one or more of the following features: first and second magnetic field sensing means of the first plurality of magnetic field sensing means are spaced equidistant from a first center axis of the means for generating, first and second magnetic field sensing means of the second plurality of magnetic field sensing means are spaced equidistant from a first center axis of the means for generating, the first distance between first pair of magnetic field sensing means of the first plurality of magnetic field sensing means is less than the second distance between second pair of magnetic field sensing means of the second plurality of magnetic field sensing means, first and second magnetic field sensing means of the first plurality of magnetic field sensing means are spaced equidistant from a first center axis of the means for generating and third and fourth magnetic field sensing means of the first plurality of magnetic field sensing means are spaced equidistant from the first center axis of the means for generating, and wherein the first and third magnetic field sensing means are spaced equidistant from a second center axis of the means for generating and the second and fourth magnetic field sensing means are spaced equidistant from the second center axis of the means for generating, first and second magnetic field sensing means of the second plurality of magnetic field sensing means are spaced equidistant from a first center axis of the means for generating and third and fourth magnetic field sensing means of the second plurality of magnetic field sensing means are spaced equidistant from the first center axis of the means for generating, and wherein the first and third magnetic field sensing means are spaced equidistant from a second center axis of the means for generating and the second and fourth magnetic field sensing means are spaced equidistant from the second center axis of the means for generating, a second sensing means having a third plurality of magnetic field sensing means and a fourth plurality of magnetic field sensing means, wherein a first pair of magnetic field sensing means of the third plurality of magnetic field sensing means are spaced a first distance from each other and a second pair of magnetic field sensing means of the fourth plurality of magnetic field sensing means are spaced a second, different distance from each other, the first magnetic field signal corresponds to a first degree of contraction of the magnetic field generated by the means for generating in response to the position of the target and the second magnetic field signal corresponds to a second, different degree of contraction of the magnet field generated by the means for generating in response to the position of the target, a circuit coupled to the first bridge structure, wherein the circuit comprises a comparison device having a first input coupled to a first output of the first sensing means to receive the first magnetic field signal and a second input coupled to a second output of the first sensing means to receive the second magnetic field signal, the circuit further comprises an offset module coupled to the first and second outputs of the first sensing means, wherein the offset module is configured to provide an offset adjustment to the first and second magnetic field signals, the circuit further comprises a converter module having an input coupled to the output of the comparison device, the axis of sensitivity of the first and second plurality of magnetic field sensing means is perpendicular to the axis of rotation of the target, the predetermined angle ranges from about 0 degrees with respect to the axis of rotation of the target to about 90 degrees with respect to the axis of rotation of the target, the first plurality of magnetic field sensing means comprises a first plurality of magnetoresistance elements and the second plurality of magnetic field sensing elements comprises a second plurality of magnetoresistance elements, and/or the first and second pluralities of magnetoresistance elements comprise one or more of giant magnetoresistance (GMR) elements, anisotropic magnetoresistance (AMR) elements, tunneling magnetoresistance (TMR) elements or magnetic tunnel junction (MTJ) elements.

In an aspect, a magnetic field sensor integrated circuit comprises: a lead frame having a first surface, a second opposing surface, and comprising a plurality of leads; a substrate having a first surface supporting a magnetic field sensing element and a second, opposing surface attached to the first surface of the lead frame, wherein the magnetic field sensing element is configured to generate a magnetic field signal indicative of movement of a target proximate to the integrated circuit; a magnet having a first surface and a second, opposing surface, and configured to generate a magnetic field; a spacer positioned between the first surface of the magnet and the second surface of the lead frame and having a thickness selected to establish a predetermined distance between the first surface of the magnet and the magnetic field sensing element, the predetermined distance selected to provide the magnetic field signal as a sinusoidal signal; and a non-conductive mold material enclosing the substrate, the spacer, and the magnet, such that at least a portion of at least one of the plurality of leads extends to an exterior surface of the non-conductive mold material.

A magnetic field sensor integrated circuit can further include one or more of the following features: the thickness of the spacer is further selected to provide the magnetic field signal with a predetermined minimum peak-to-peak signal level, a ratio of the thickness of the spacer to a thickness of the magnet between the first surface of the magnet and the second surface of the magnet is selected to provide the magnetic field signal with the predetermined minimum peak-to-peak signal level and with less than a predetermined amount of deformation based at least in part on a nominal expected airgap distance between the magnetic field sensing element and the target and a size of the non-conductive mold material, the spacer is comprised of a material having a magnetic permeability approximately equal to air, the sinusoidal signal has less than a predetermined amount of deformation, wherein the predetermined amount of deformation is based on at least one of a level of harmonics in the magnetic field signal and a determination of an error curve as a difference between a nominal sinusoidal signal and the magnetic field signal, the spacer has a thickness of approximately 2.4 millimeters, the predetermined distance between the first surface of the magnet and the magnetic field sensing element is approximately 3.2 mm, the spacer comprises at least one of a copper material or an aluminum material, a first attachment mechanism disposed between the spacer and the magnet, the first attachment mechanism comprises one or more of a conductive or non-conductive adhesive, epoxy, tape, film or spray, a second attachment mechanism disposed between the spacer and the second surface of the lead frame, the second attachment mechanism comprises one or more of a conductive or non-conductive adhesive, epoxy, tape, film or spray, a third attachment mechanism disposed between the second surface of the substrate and the first surface of the lead frame, the third attachment mechanism comprises one or more of a conductive or non-conductive adhesive, epoxy, tape, film or spray, the substrate comprises a semiconductor die, and/or the magnet comprises a sintered magnet or a ferromagnetic element or both.

In another aspect, a magnetic field sensor integrated circuit comprises: a lead frame having a first surface, a second opposing surface, and comprising a plurality of leads; a substrate having a first surface supporting a magnetic field sensing element and a second, opposing surface attached to the first surface of the lead frame, wherein the magnetic field sensing element is configured to generate a magnetic field signal indicative of movement of a target proximate to the integrated circuit; a magnet having a first surface and a second, opposing surface, and configured to generate a magnetic field, wherein a first surface of the magnet is disposed at a predetermined distance from the magnetic field sensing element, the predetermined distance selected to provide the magnetic field signal as a sinusoidal signal; and a non-conductive mold material enclosing the substrate and the magnet, such that at least a portion of at least one of the plurality of leads extends to an exterior surface of the non-conductive mold material.

A magnetic field sensor integrated circuit can further include one or more of the following features: a spacer disposed between the first surface of the magnet and the second surface of the lead frame and wherein the predetermined distance is established by a thickness of the spacer, the predetermined distance is established by a thickness of the lead frame, and/or the sinusoidal signal has less than a predetermined amount of deformation.

In a further aspect, a method of generating a magnetic field signal indicative of movement of a target, the method comprising: attaching a substrate to a first surface of a lead frame comprising a plurality of leads, the substrate having a first surface supporting a magnetic field sensing element configured to generate the magnetic field signal indicative of movement of the target proximate to the magnetic field sensing element and a second, opposing surface attached to the first surface of the lead frame; spacing a magnet from the magnetic field sensing element by a predetermined distance that is selected so that the magnetic field sensing element provides the magnetic field signal as a sinusoidal signal; and molding over the substrate and the magnet with a non-conductive mold material.

A method can further include one or more of the following features: the predetermined distance is selected to provide the magnetic field signal with a predetermined minimum peak-to-peak signal level, the spacing comprises: attaching a spacer to the magnet with a first attachment mechanism comprising one or more of a conductive or non-conductive adhesive, epoxy, tape, film or spray, and/or attaching the spacer to the second surface of the lead frame with a second attachment mechanism comprising one or more of a conductive or non-conductive adhesive, epoxy, tape, film or spray.

BRIEF DESCRIPTION OF THE DRAWINGS

The foregoing features of the invention, as well as the invention itself may be more fully understood from the following detailed description of the drawings, in which:

FIGS. 5A-5C show flux deflections for respective distances of a target for the sensor orientation of FIG. 5;

DETAILED DESCRIPTION

Figure 1:
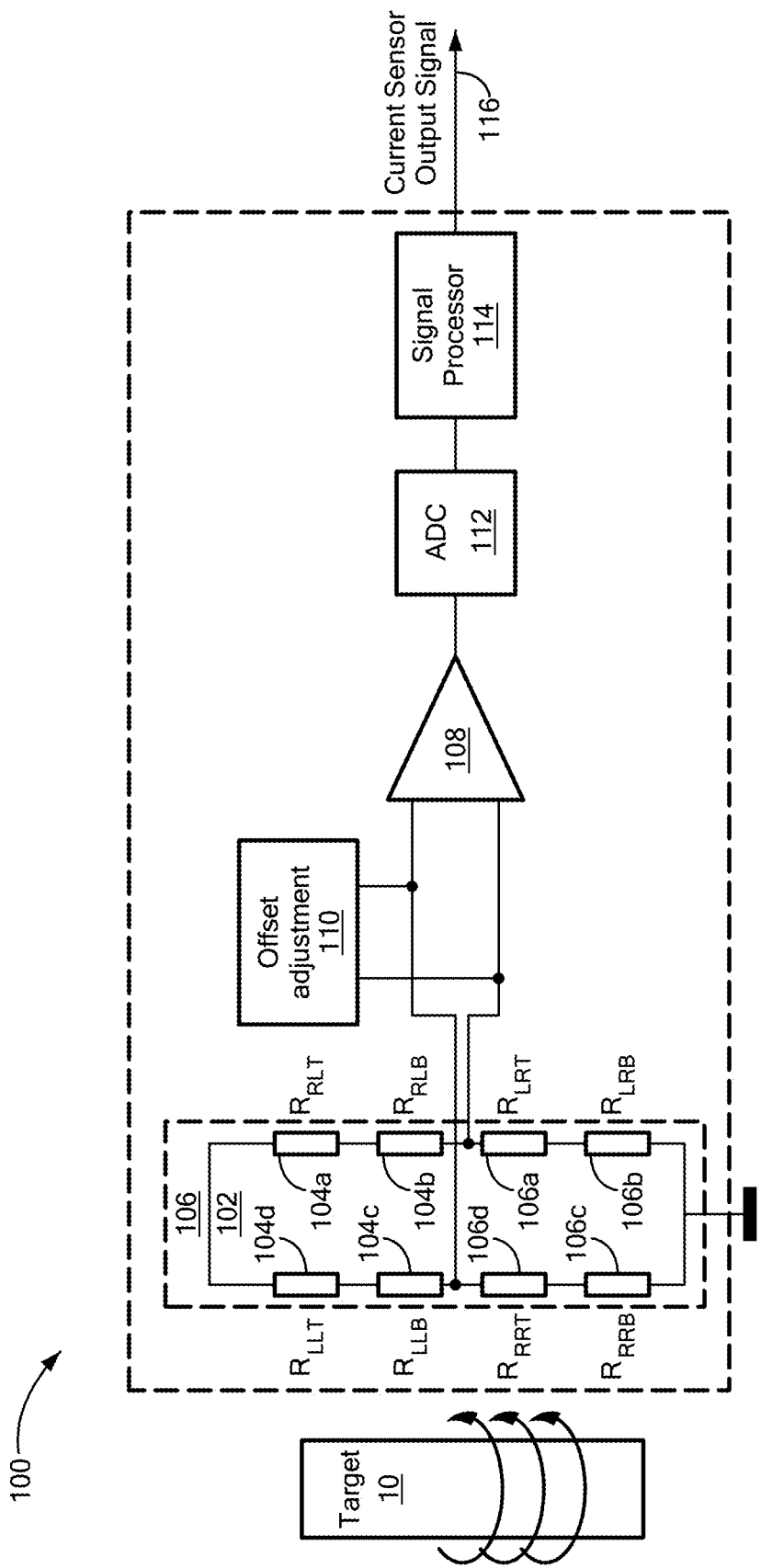
FIG. 1 is a schematic representation of a magnetic field sensor having sensing element bridges having example orientations.

FIG. 1 shows an example magnetic field sensor 100 having some immunity to common mode fields including field peaks. The sensor 100 includes at least one bridge 102 for generating sensing signals and canceling out common mode fields. In embodiments, the bridge 102 includes magnetic field sensing elements 104a-d, 106a-d positioned in relation to a back bias magnet 106, as described more fully below. The magnetic field sensing elements 104 and 106 can detect movement of a target 10. In embodiments, rotational and/or lateral movement of the target 10 can be detected, as described below.

The bridge 102 has elements 104,106 electrically connected as shown. A first connection to the amplifier 108 is between bridge elements 104c and 106d and a second connection to the amplifier is between bridge elements 104b and 106a.

In embodiments, the sensor 100 includes an amplifier 108 to receive the output from the bridge 102. The sensor can also include an offset adjustment module 110 coupled to the bridge output. The amplifier 108 output can be digitized with an ADC 112 to provide digital signals to a signal processor 114, which can output a sensor output signal 116.

Figure 2:
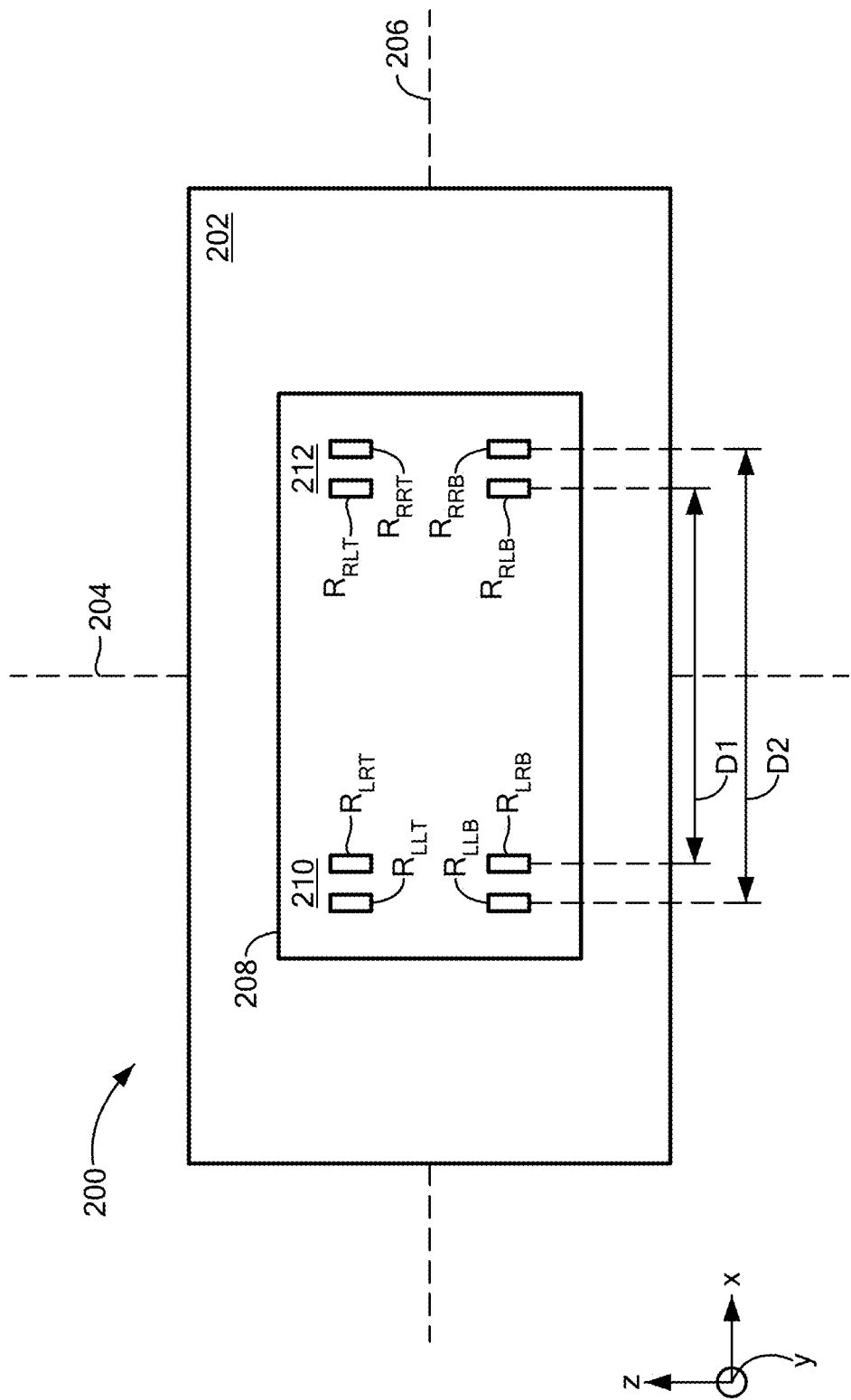
FIG. 2 is a schematic representation of first and second sensing element bridges positioned in relation to a magnet.

FIG. 2 shows a portion 200 of a sensor including a magnet 202 having a first axis of symmetry 204 and a second axis of symmetry 206. In the illustrated embodiment, the first and second axes of symmetry 204, 206 lie in the x-z plane. A y-axis is orthogonal to the x-z plane. A die 208 is positioned over the magnet 202 and can include magnetic field sensing elements forming a bridge 210 which can correspond to the bridge 102 and bridge elements 104, 106 of FIG. 1. In an example embodiment, the bridge 210 comprises magnetic field sensing elements Rm,n,o. In the illustrated embodiments, the elements can be located at a bridge position in relation to the magnet 202. For example, each element R can be identified as Rm,n,o, where m indicates a left or right (L or R) bridge, n indicates a left or right position within the particular die or half die, and o indicates a top or bottom position (T or B) within the bridge.

As can be seen, the bridge elements 104a-d, 106a-d of FIG. 1 are shown with electrical circuit connections, wherein the bridge elements Rm,n,o of FIG. 2 are shown in a physical location with respect to the magnet 202 and axes 202, 204. For example, magnetic field sensing element $R_{RRT}$ shows the element in the right bridge R on the right side R of the right bridge at the top T of the bridge. Magnetic field sensing element $R_{LLB}$ shows the element in the left bridge L on the left side L of the left bridge at the bottom B of the bridge.

In an example embodiment, a first distance D1 is centered about the first axis of symmetry 204 and is extended from at least one of the inner magnetic field sensing elements $R_{LRX}$ of the bridge 210 to at least one of the inner magnetic field sensing elements $R_{RLX}$ of the bridge. A second distance D2 is centered about the first axis of symmetry 204 and extended from at least one of the outer magnetic field sensing elements $R_{LLX}$ of the bridge 210 to at least one of the outer magnetic field sensing elements $R_{RRX}$ of the bridge. In embodiments, the second distance D2 is greater than the first distance D1. In another embodiment, the first and second distance D1, D2 are substantially equal.

Figure 3B:
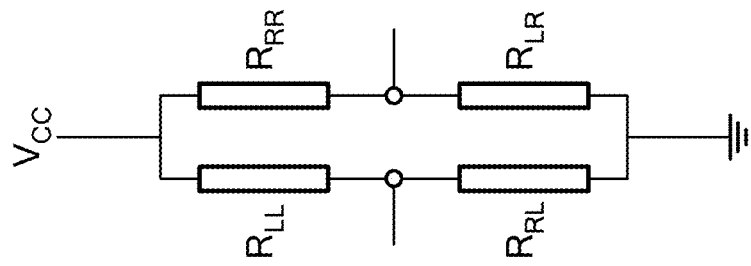
FIG. 3A is a schematic representation of a sensor having a sensing element bridge and FIG. 3B shows an example circuit connection of the bridge sensing elements.
Figure 3A:
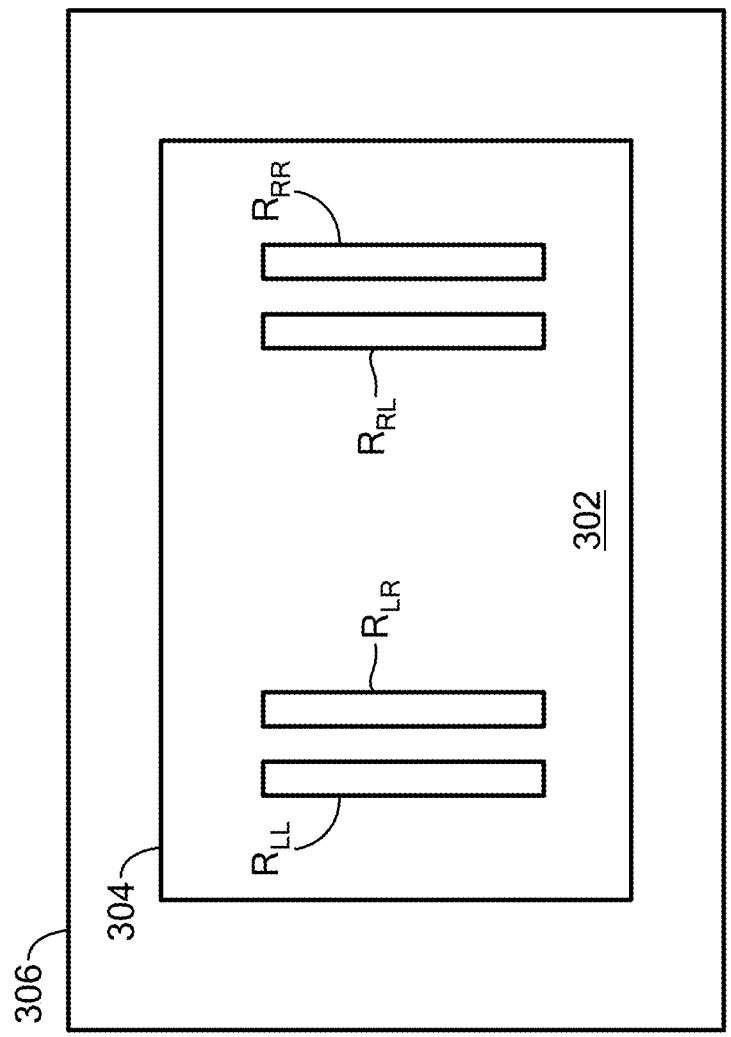

FIG. 3A shows an example sensor 300 having a single bridge configuration 302 on a die 304 disposed on a magnet 306. The bridge 302 include a left L and right R portion and a left side L and a right side R for the particular left or right portion of the bridge. The elements are shown as $R_{LL}$, $R_{LR}$, $R_{RL}$, $R_{RR}$. FIG. 3B shows the electrical connections of the bridge elements.

Figure 4:
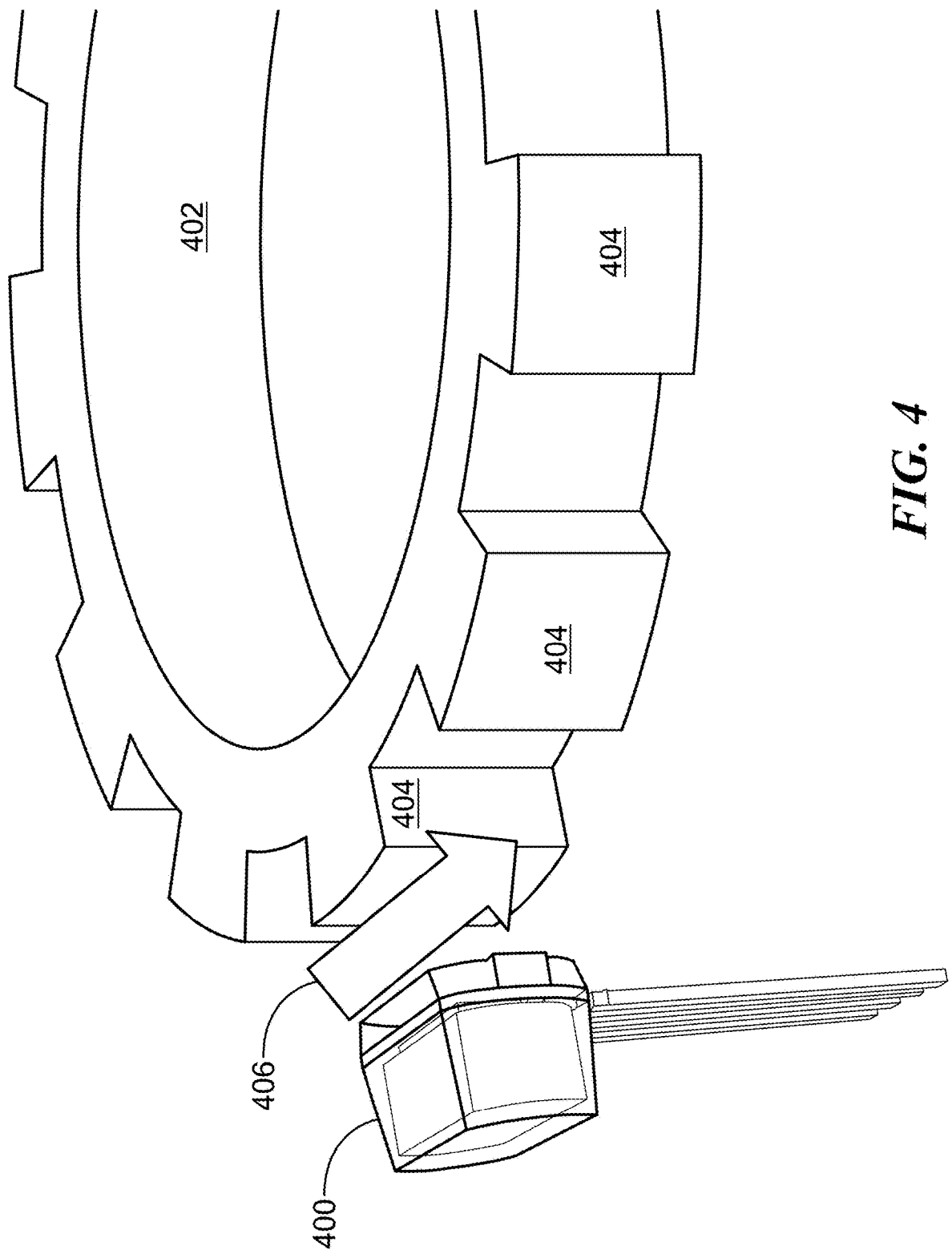
FIG. 4 is a schematic representation of magnetic sensor IC package in a first orientation in relation to a rotating target.
Figure 4C:
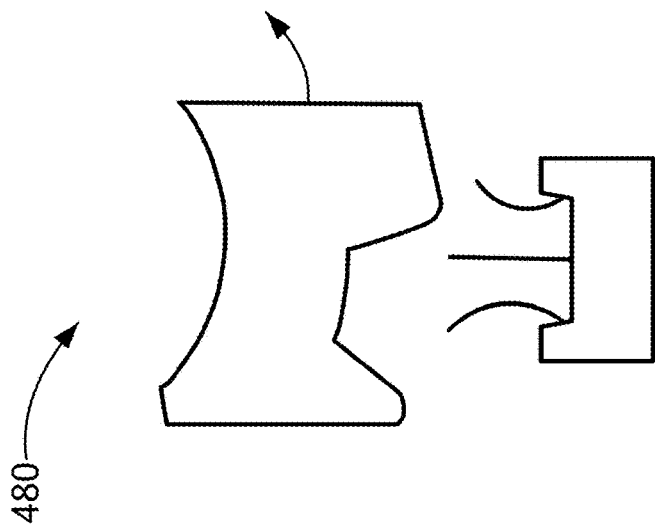
FIGS. 4A-4C show flux deflections for respective positions of a rotating gear tooth target for the sensor orientation of FIG. 4.
Figure 4B:
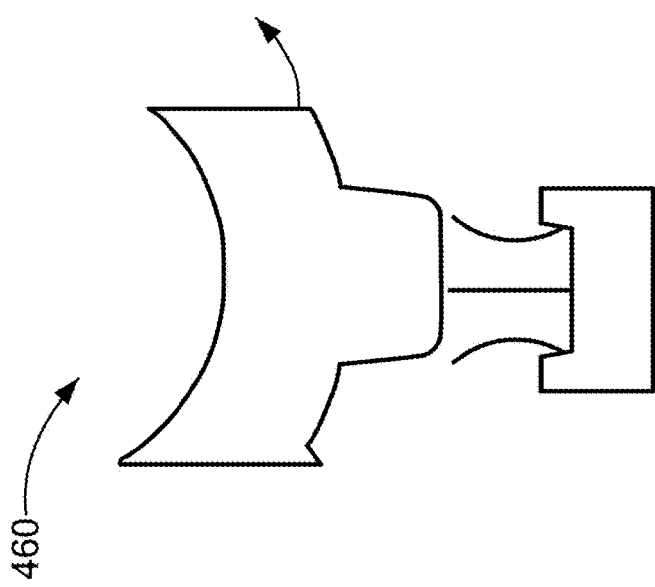
Figure 4A:
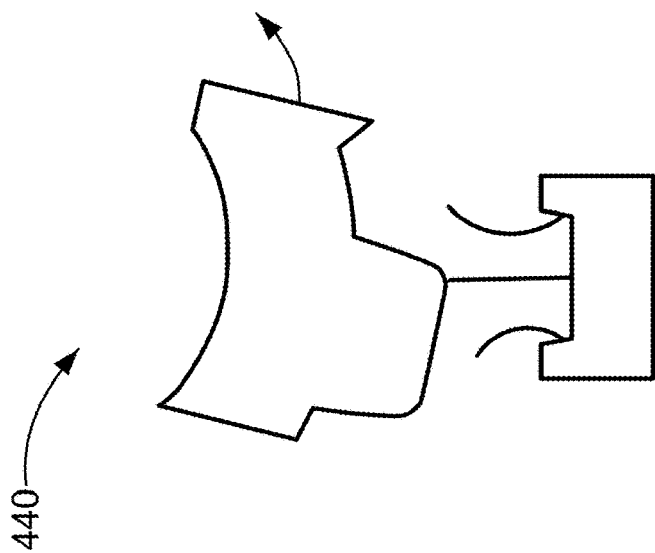

FIG. 4 shows an example magnetic field sensor integrated circuit (IC) package 400 in a first orientation in relation to a rotating structure 402 having gear teeth 404. In the illustrated embodiment, the back bias position of the sensor 400 can be considered the 0 degree position. The axis of sensitivity 406 is shown for the sensor IC 400. FIG. 4A shows a first configuration 440 when field deflection when the gear tooth 404 is at the leading edge in relation to a magnet of the sensor, FIG. 4B shows a second configuration 460 when field deflection when the gear tooth center is aligned with the magnet, and FIG. 4C shows a third configuration 480 when the field deflection when the gear tooth is at a trailing edge. In the 0 degree orientation, the magnetic field sensor axis of sensitivity 406 is along the direction of motion of the gear tooth. The sensing elements experience the same signal but with a phase shift due to different positions along the axis 406.

Figure 5:
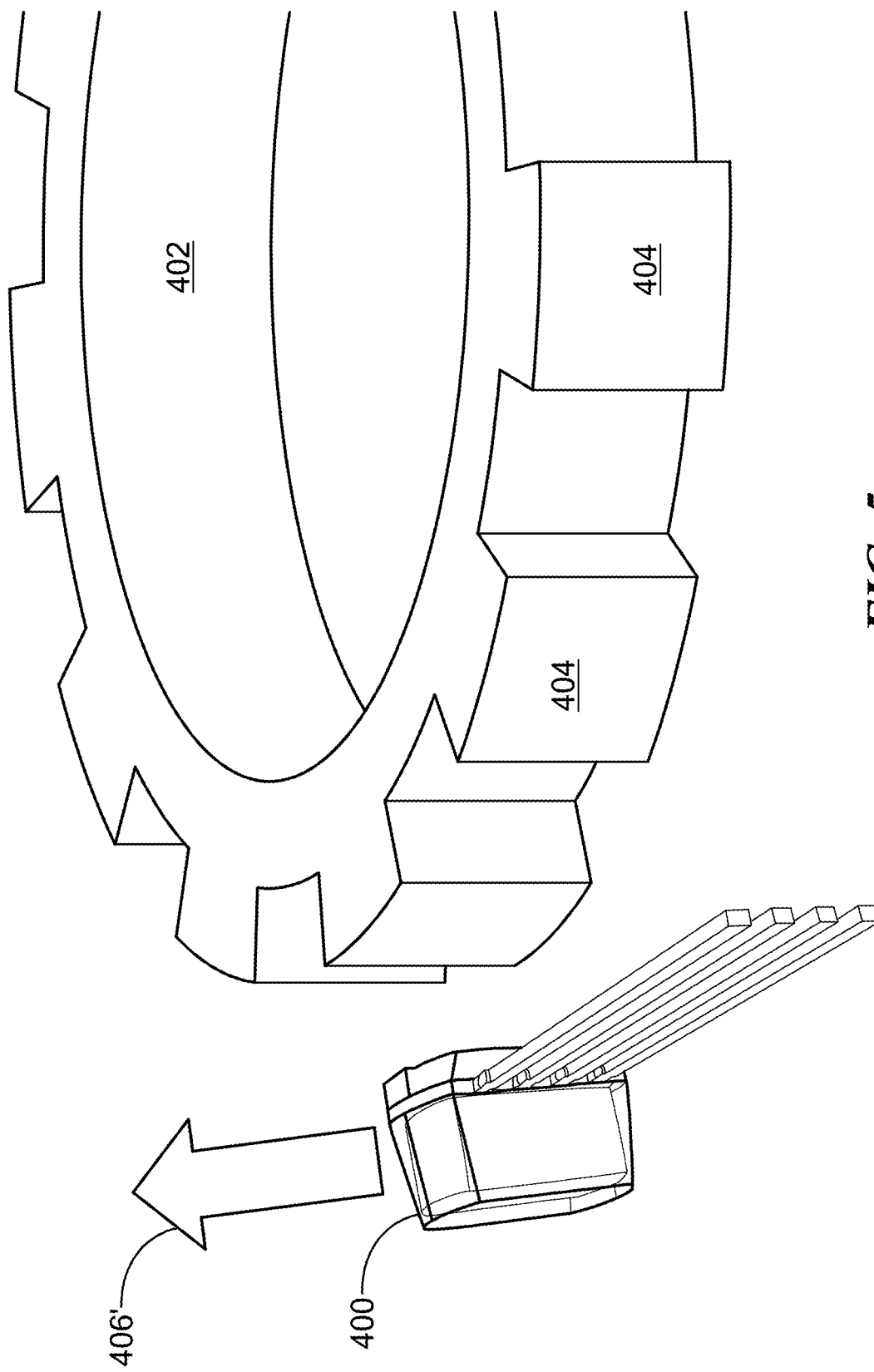
FIG. 5 is a schematic representation of a magnetic sensor IC package in a second orientation in relation to a rotating target.

FIG. 5 shows the magnetic field sensor integrated circuit (IC) package 400 in a second orientation in relation to a rotating structure 402 having gear teeth 404. The axis of sensitivity 406' is perpendicular to the direction of rotation of the target. In the illustrated embodiment of FIG. 5, the back bias position of the sensor 400 can be considered the ninety degree position. In this configuration, the sensor is not sensing flux line deflection by the tooth edges, but rather, senses a variation in divergence of the magnetic flux lines coming from the back bias magnet. FIG. 5A shows a first field distribution for a target 50 having a surface 52 at a first distance d1 from a magnet 500 of a sensor. FIG. 5B shows a second field distribution for the target surface 52 at a second distance d2 from the magnet 500. FIG. 5C shows a third field distribution for a target 50 having a surface 52 at a third distance d3 from a magnet 500 of a sensor. As can be seen, the example dark flux lines on the left of FIG. 5A have a different divergence than the dark flux lines on the left of FIG. 5C. The divergence variations can be detected the sensing elements. It is understood that the above provides a target proximity sensor by detecting flux line divergence variation due to a varying distance of the target from the back bias magnet. It should be noted that the phase shifts in the 90 degrees orientation are not detected.

In embodiments, the electrical connections of the bridge elements 104a-d, 106a-d in series shown in FIG. 1 correspond to the 90 degree orientation of FIG. 5. This arrangement enables the positioned bridge elements 104, 106 to detect variation in flux line divergence from the back bias magnet.

While example embodiments are shown and described in conjunction with zero and ninety degree orientations, it understood that the respective orientations can range from 0 to 360 degrees to meet the needs of a particular embodiment. It will be appreciated that a 0 degree orientation and a 180 degree orientation may be equivalent due to the symmetry of the system. In embodiments, due to the symmetry of the system, what works at an orientation angle X also works at angle X+90, −X and −X−90, thus providing a system that operates over a 360 degree range.

Figure 6:
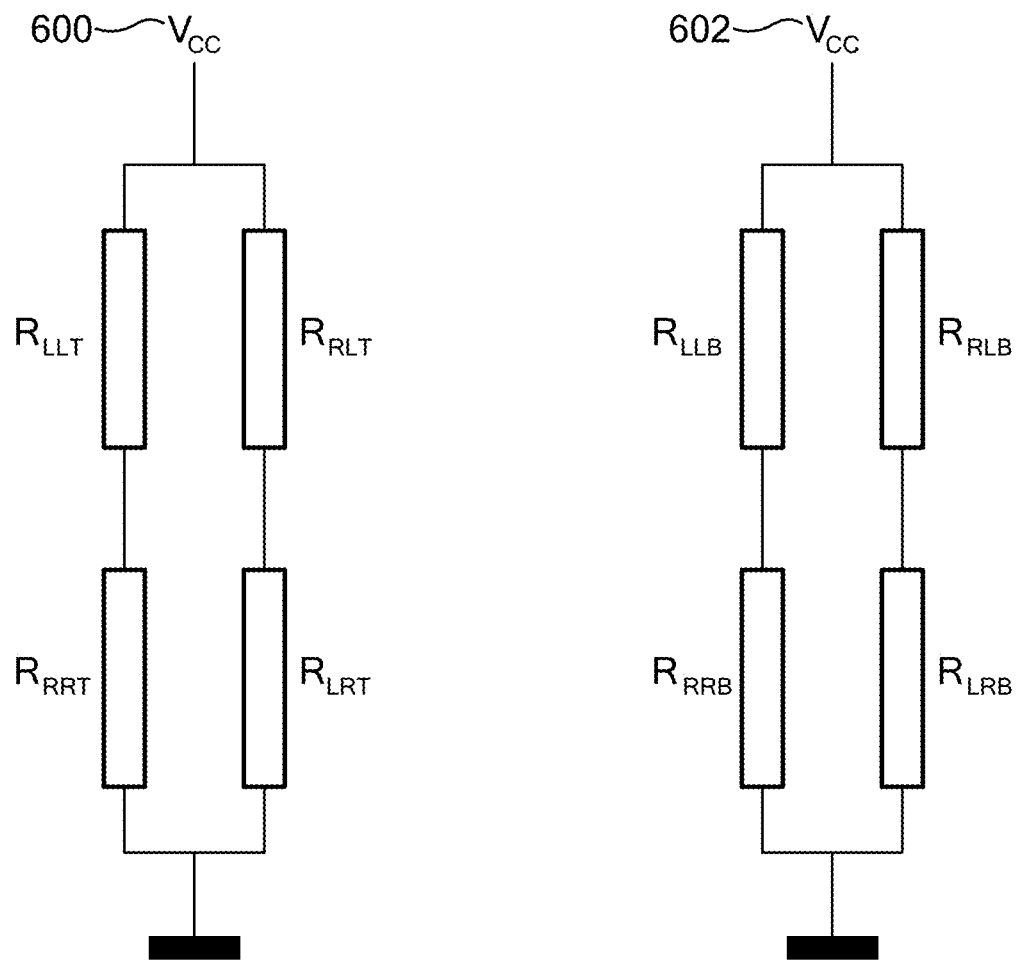
FIG. 6 is a circuit diagram showing electrical bridge sensing element connections for the sensor orientation of FIG. 5.

FIG. 6 shows an example circuit connection of bridge elements to recover direction sensing in the ninety degree orientation of FIG. 5. It is understood that the bridge elements can be physically positioned in relation to the magnet as shown in FIG. 2. The magnetic field sensing elements are connected so as to recover direction sensing when the sensor is positioned at the 90 degree position for rotating targets. In the illustrated embodiment, a first bridge 600 includes magnetic field sensing elements $R_{LLT}$, $R_{RRT}$, $R_{LRT}$, $R_{RLT}$ and a second bridge 602 includes magnetic field sensing elements $R_{LLB}$, $R_{RRB}$, $R_{LRB}$, $R_{RLB}$. The first and second bridges 600, 602, generate differential first and second signals from which a phase shift can be recovered for direction sensing.

In embodiments, bridge elements are shared and selectively connected to achieve the example circuit connections shown in FIG. 1 and FIG. 6. In other embodiments, bridge elements are dedicated to the circuit configurations shown in FIG. 1 and FIG. 6.

Figure 7:
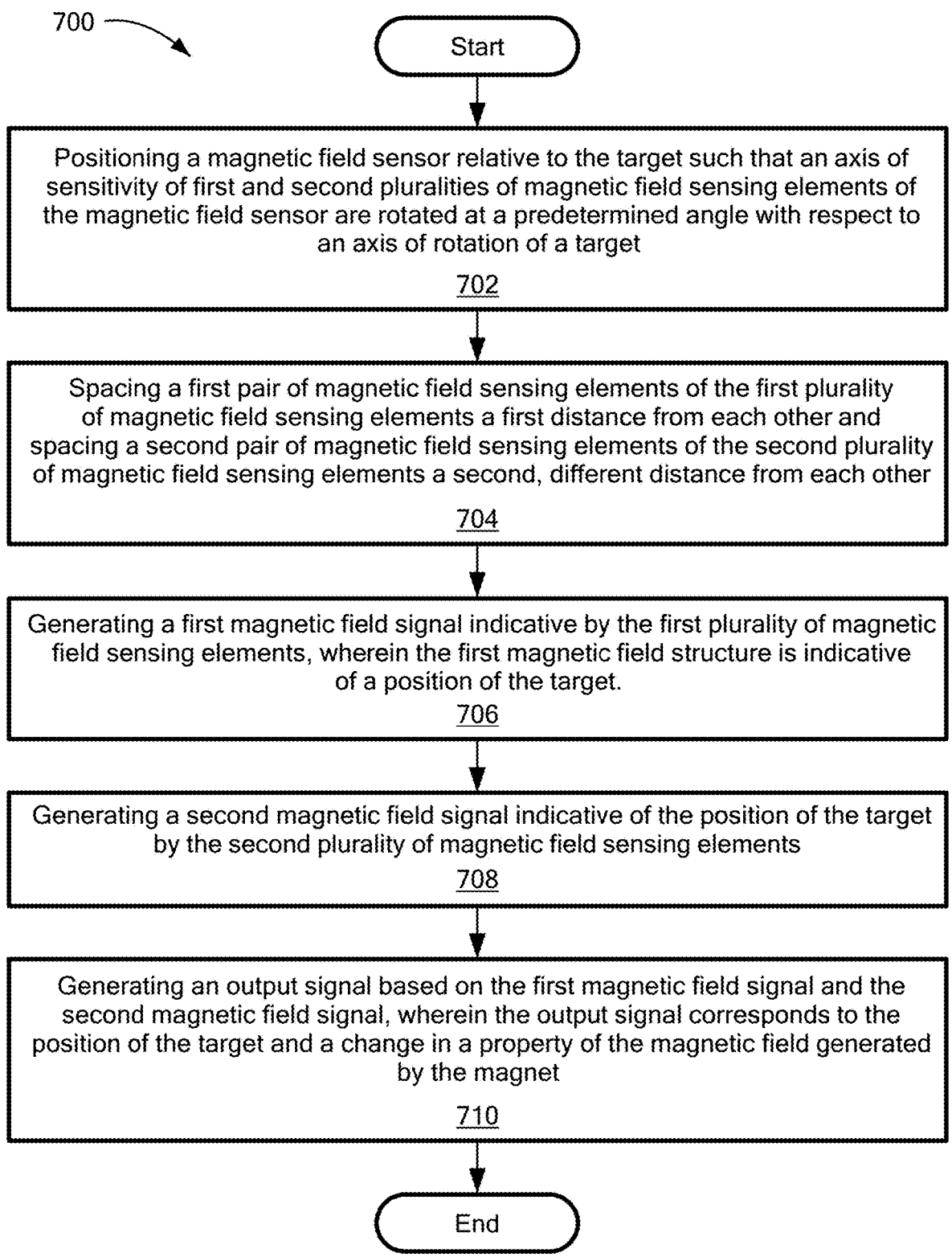
FIG. 7 shows an example sequence of steps for providing a magnetic field sensor operation at multiple orientations in relation to a target.

FIG. 7 shows an example process 700 for providing a magnetic field sensor in accordance with example embodiments of the invention. In step 702, a magnetic field sensor is positioned relative to a target such that an axis of sensitivity of first and second pluralities of magnetic field sensing elements of the magnetic field sensor are rotated at a predetermined angle with respect to an axis of rotation of a target. In step 704, a first pair of magnetic field sensing elements of the first plurality of magnetic field sensing elements can be spaced a first distance from each other and spacing a second pair of magnetic field sensing elements of the second plurality of magnetic field sensing elements a second, different distance from each other. In step 706, a first magnetic field signal is generated by the first plurality of magnetic field sensing elements, wherein the first magnetic field structure is indicative of a position of the target. In step 708, a second magnetic field signal indicative of the position of the target is generated by the second plurality of magnetic field sensing elements. In step 710, an output signal is generated based on the first magnetic field signal and the second magnetic field signal, wherein the output signal corresponds to the position of the target and a change in a property of the magnetic field generated by the magnet.

Embodiments of a magnetic field sensor are described that have some immunity, which can be provided by differential bridge structures to cancel out the common mode. Embodiments of a magnetic field sensor with back bias can sense target direction in a first, e.g., zero degree, orientation, and sense vicinity of a ferromagnetic target in a second, e.g., 90 degree, orientation. In this sensing mode, the sensor is not sensing the flux line deflection by the target in the form of gear tooth edges, for example, rather in the second orientation the sensor senses the variation of the divergence of the magnetic flux lines coming from the back biasing magnet.

In example embodiments, MR elements are used as sensing elements in the bridges to detect flux change. It understood that any suitable magnetic field sensing element can be used to meet the needs of a particular application.

In aspects of the invention, embodiments a resolver sensor can obtain target angle information using a signal die and target. In other embodiments, multiple targets and/or multiple sensors can be used for position encoding. In some embodiments, angle information can be obtained using example sensors, as described above. In other embodiments, sensors can include a double spin valve stack, as described below.

Figure 8:
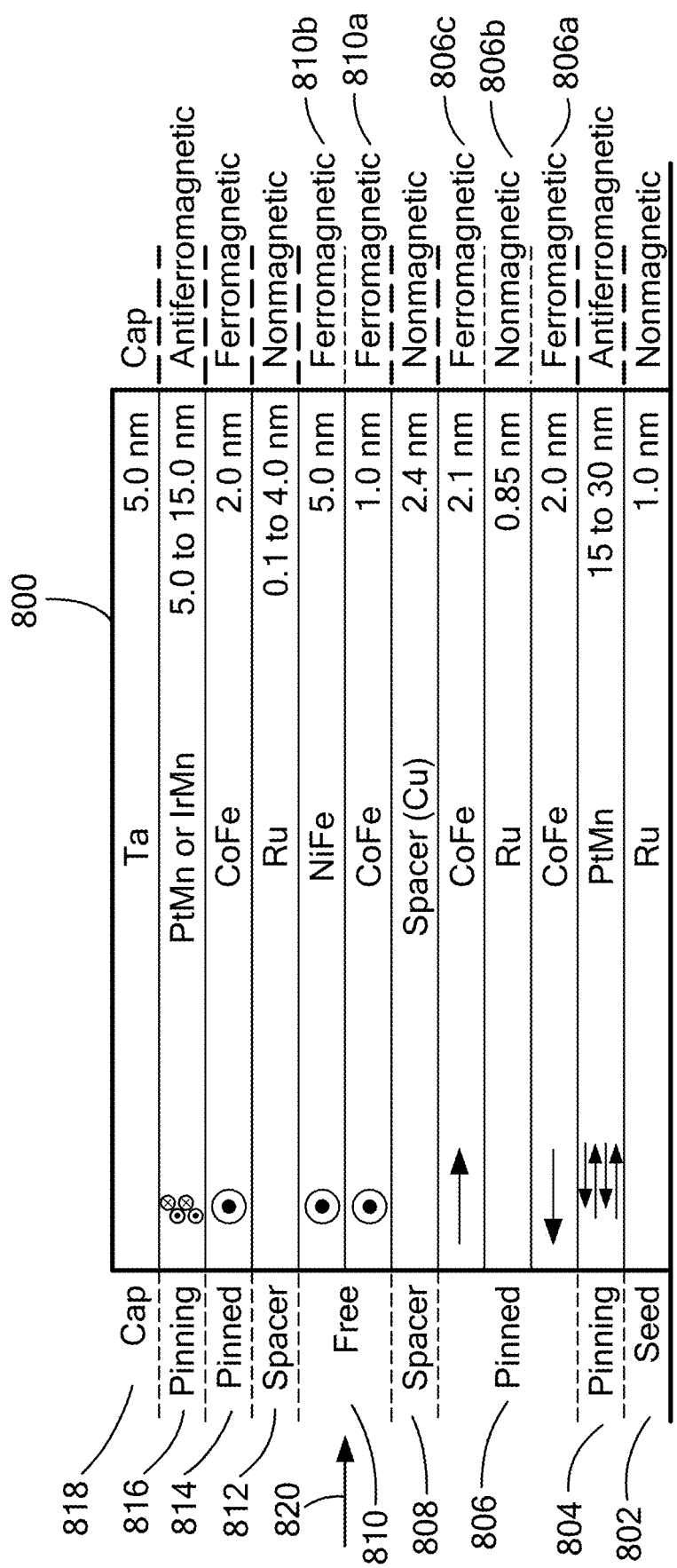
FIG. 8 is a block diagram showing layers of an example of a magnetoresistance element having a particular double pinned arrangement.

Referring now to FIG. 8, an example of a double pinned GMR element 800 includes a plurality of layers disposed over a substrate, as shown and described in U.S. Patent Publication No. US 2016/0359103, which is incorporated herein by reference. An upper surface of the substrate is shown as a dark line at the bottom of FIG. 8. On the left side of FIG. 8, each layer is identified by functional name. On the right side or FIG. 8 are shown magnetic characteristics of sublayers that can form the functional layers.

Examples of thicknesses of the layers of the GMR element 800 are shown in nanometers. Examples of materials of the layers of the GMR element 800 are shown by atomic symbols.

The exemplary GMR element 800 can include a seed layer 802 disposed over the substrate, an antiferromagnetic pinning layer 804 disposed over the seed layer 802, and a pinned layer 806 disposed over the antiferromagnetic pinning layer 804. However, in some embodiments, the pinned layer 806 can be comprised of a first ferromagnetic pinned layer 806a, a second ferromagnetic pinned layer 806c, and a spacer layer 806b disposed therebetween. In some embodiments, the spacer layer 806b is comprised of a nonmagnetic material. In some other embodiments, the pinned layer 806 can instead be comprised of one pinned layer.

Due to the presence of the spacer 806b between the first and second ferromagnetic pinned layers 806a, 806c, the second ferromagnetic pinned layer 806c tends to couple antiferromagnetically with the first ferromagnetic pinned layer 806a, and thus, it has a magnetic field pointing in the other direction, here shown pointing to the right. As described above, the combination of the three layers 806a, 806b, 806c can be referred to as a synthetic antiferromagnetic structure or layer.

The exemplary GMR element 800 can also include a spacer layer 808 disposed over the second ferromagnetic pinned layer 806c, and a free layer 810 disposed over the spacer layer 808. In some embodiments, the free layer 810 can be comprised of a first ferromagnetic free layer 810a disposed under a second ferromagnetic free layer 810b. In some embodiments, the spacer layer 808 is comprised of a nonmagnetic material (e.g., conductive Cu for GMR or an insulating material for TMR).

The GMR element 800 of FIG. 8 can further include a spacer layer 812 disposed over the second ferromagnetic free layer 810b, and a second pinned layer 814 disposed over the spacer layer 812. In some embodiments, the second pinned layer 814 can be comprised of a ferromagnetic material. In some embodiments, the spacer layer 812 is comprised of a nonmagnetic material (e.g., Ru). The GMR element 800 of FIG. 8 can further include a second antiferromagnetic pinning layer 816 disposed over the second pinned layer 814. A cap layer 818 can be disposed at the top of the GMR element 800 to protect the GMR element 800.

Within some layers, arrows are shown that are indicative or directions of magnetic fields of the layers when the GMR element 800 does not experience an external magnetic field. Arrows coming out of the page are indicated as dots within circles and arrows going into the page are indicated as crosses within circles.

In some embodiments, the seed layer 802 is comprised of Ru or Ta, and the first antiferromagnetic pinning layer 804 is comprised of PtMn. In some embodiments, the first pinned layer 806 is comprised of the first ferromagnetic pinned layer 806a comprised of CoFe, the spacer layer 806b comprised of Ru, and the second ferromagnetic pinned layer 806c comprised of CoFe. In some embodiments, the spacer layer 808 is comprised of Cu (or alternatively, Au, or Ag). In some embodiments, the first ferromagnetic free layer 810a is comprised of CoFe and the second ferromagnetic free layer 810b is comprised of NiFe. In some embodiments, the spacer layer 812 is comprised of Ru (or alternatively, Au, or Ag), the second pinned layer 814 is comprised of CoFe, the second antiferromagnetic pinning layer 816 is comprised of PtMn, and the cap layer 818 is comprised of Ta. However, other materials are also possible.

The spacer layer 812 being comprised of Ru (or Au, or Ag) allows realizable ranges of thicknesses (described below) of the spacer layer 812 to allow for partial pinning of the free layer 810. Partial pinning is described more fully below.

In some other embodiments, the first and second antiferromagnetic pinning layers 804 and 816 can be comprised of IrMn, FeMn, or any other type of antiferromagnetic material. PtMn or IrMn are shown in the figure, and PtMn is used in examples below. In some other embodiments, the second pinned layer 814 can instead be comprised of a plurality of sublayers, the same as or similar to the sublayers of the first pinned layer 806. In some other embodiments, the spacer layer 808 can be comprised of Ta or Cu.

A thickness of the spacer layer 812 is selected to provide a desired amount of (i.e., a partial) magnetic coupling between the second pinned layer 814 and the free layer 810. Also, the thickness of the spacer layer 812 is selected to provide a desired type of magnetic coupling between the second pinned layer 814 and the free layer 810, i.e., ferromagnetic coupling or antiferromagnetic coupling, or between ferromagnetic and antiferromagnetic coupling. Here, the coupling is shown to be ferromagnetic coupling, but, by selection of the thickness of the spacer layer 812, the coupling can be antiferromagnetic or between ferromagnetic and antiferromagnetic coupling. In other words, in the absence of an external magnetic field it is possible for a direction of magnetic fields of the free layers 810 to be rotated either as shown (out of the page) or into the page, depending upon a selected thickness of the spacer layer 812.

Taking CoFe and NiFe to have similar magnetic properties, it will be recognized that the layers of materials above the first ferromagnetic free layer 810a and below the first ferromagnetic free layer 810a are similar, but in reversed order, namely, NiFe (or CoFe)/Ru/CoFe/PtMn. However, it is desired that the spacer layer 806b provides high coupling between surrounding layers, thus it is thin, while it is desired that the spacer layer 812 provide less coupling between surrounding layers, thus it is thicker.

Ru is well suited for the spacer layer 812 because it allows antiferromagnetic or ferromagnetic coupling (also called Ruderman Kittel Kasuya Yoshida or RKKY coupling) between surrounding layers, according to the Ru thickness. In essence, the Ru material permits coupling through it, as opposed to in spite of it. This allows for a thicker Ru layer 812, with a range of achievable thickness values, to achieve and to tune the desired partial pinning of the free layer 810.

In some embodiments, the thickness of the Ru spacer layer 812 is selected to provide an RKKY coupling of between about −50 mT and about 50 mT. The RKKY coupling tends to be stable with respect to possible process drift, i.e., the amount of coupling tends to remain constant and stable even for a thickness change of about ten percent in the Ru layer due to manufacturing process variations or the like.

The second pinned layer 814, having a pinned magnetic field pointing direction aligned with a pointing direction of the magnetic field in the free layer 810, tends to cause particular behavior within the free layer 810. In particular, the pointing direction of the magnetic field in the second pinned layer 814 causes a reduction in the number of magnetic domains in the free layer 810 that point at directions other than the direction of the net magnetic field of the free layer, i.e., a reduction in the number of magnetic domains that point in directions other than out of the page when in the presence of no external magnetic field.

The ferromagnetic free layers 810a, 810b tend to naturally have a plurality of magnetic domains, including, but not limited to, a first plurality of magnetic domains with magnetic fields pointing in a first direction and a second plurality of magnetic domains with magnetic fields pointing in one or more directions different than the first direction. The first direction described above can be parallel to upper and lower surfaces of the free layer 810. The first plurality of magnetic domains have magnetic field pointing directions that are aligned with the net magnetic field of the free layer 810 shown to be coming out of the page when the GMR element 800 is not exposed to an external magnetic field, but which can rotate as the GMR element 800 is exposed to a magnetic field. As described above, the magnetic field pointing direction of the first plurality of magnetic domains in the free layer 810 rotates in response to an external magnetic field. The second plurality of magnetic domains will tend to have magnetic field pointing directions that point in the one or more directions different than the first direction.

The second pinned layer 814 is operable to partially magnetically couple, through the spacer layer 812, to the free layer 810, to reduce a number of magnetic domains (i.e., to reduce a quantity of magnetic domains in the second plurality of magnetic domains) in the free layer 810 that point in a direction other than the first direction, i.e., other than the direction of the net magnetic field in the free layer 810 in the absence of an external magnetic field.

By partial pinning, it is meant that there is less magnetic coupling between the second pinned layer 814 and the free layer 810 than between the first pinned layer 806 and the free layer 810. An amount of partial pinning is determined in part by a material and a thickness of the spacer layer 812.

The PtMn first and second antiferromagnetic pinning layer 804, 816 can have a Neel temperature and a blocking temperature that are both above about three hundred degrees Celsius. This high temperature is important to eliminate loss of magnetic characteristics of the GMR element 800 in high temperature applications, for example, automobile applications.

While the layers of the GMR element are shown in a particular order, it should be understood that, in other embodiments, the layers 804, 806 (i.e., 806a, 806b, 806c), and 808 can be exchanged with the layers 816, 814, 812, respectively. In some embodiments, all of the layers shown in FIG. 8, except for the seed layer and the cap layer, can be reversed in order from bottom to top.

For a GMR element, the spacer layer 808 is a metallic nonmagnetic layer (usually Copper). For a TMR element, the spacer layer 808 is an insulating nonmagnetic layer (e.g., Al2O3 or MgO). Otherwise, the GMR element 800 can have layers the same as or similar to a comparable TMR element. Thus, a TMR element is not explicitly shown.

Figure 9:
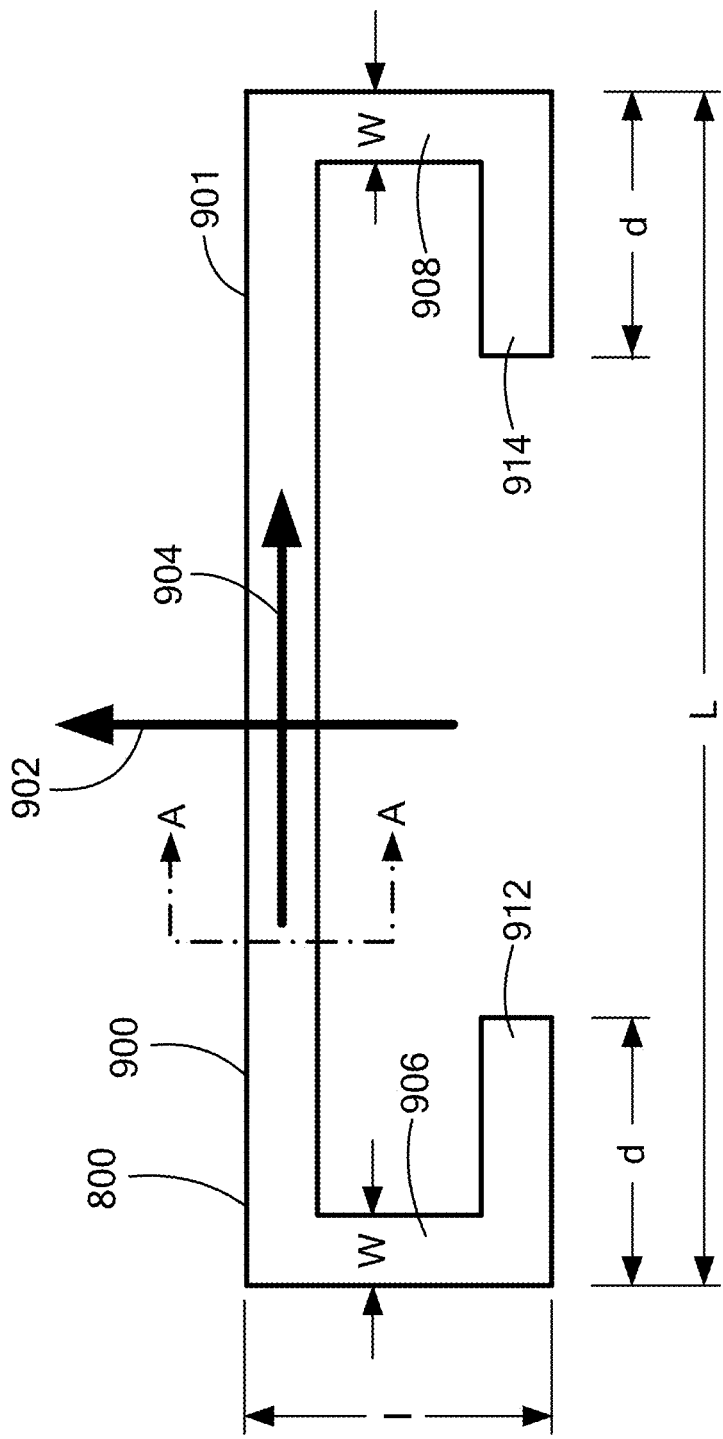
FIG. 9 is a top view diagram of magnetic field sensing element having a yoke shape that, in some embodiments, can describe a shape of the magnetoresistance element of FIG. 8.

Referring now to FIG. 9, in which like elements of FIG. 8 are shown having like reference designations, according to a specific embodiment, the magnetoresistance element 800 of FIG. 8, and also magnetoresistance elements, can be formed in the shape of a yoke 900.

The yoke 900 has a main part 901, two arms 906, 908 coupled to the main part 901, and two lateral arms 912, 914 coupled to the two arms 906, 908, respectively. In some embodiments, the main part 901, the two arms 906, 908, and the two lateral arms 912, 914 each have a width (w). However, in other embodiments, the widths can be different.

A length (L) of the yoke 900 and a length (d) of the lateral arms 912, 914 of the yoke 900 are each at least three times the width (w) of the yoke 900, and the width (w) of the yoke 900 can be between about one μm and about twenty μm.

The yoke dimensions can be, for example, within the following ranges:
 the length (L) of the main part 901 of the yoke 900 can be between about ten μm and ten millimeters;
 the length (l) of the arms 906, 908 of the yoke 900 can be at least three times the width (w);
 the width (w) of the yoke 900 can be between about one μm and about twenty μm.

The arms 906, 908 of the yoke 900 are linked to the lateral arms 912, 914, which are parallel to the main part 901, and have a length 1 which is between about ¼ and ⅓ of the overall length (L).

In general, sensitivity of the magnetoresistance element 800 having the yoke shape 900 decreases with the width (w), and the low frequency noise of the magnetoresistance element 800 increases with the width (w).

The yoke shape offers better magnetic homogeneity in a longitudinally central area of the main part 901. This is due to the demagnetizing field of the yoke length which is mainly along the main part 901, and this induces an anisotropy of the free layer 810 of FIG. 8, which can be seen as a magnetization at zero field along the length of the yoke 900. If the pinned layer (e.g., 806 of FIG. 8) has a magnetic field perpendicular to the yoke (e.g., arrow 902), when an external field is applied in direction of the arrow 902, the free layer 810 magnetization rotates uniformly, i.e. without domain jumps.

For a GMR element, the overall stack can be designed in a yoke shape, but for a TMR element, in some embodiments, only the free layer can have a yoke shape. In other embodiments, the GMR or TMR elements 800 is not formed in the shape of a yoke, but is instead formed in the shape of a straight bar, e.g., having the dimensions L and w, and not having features associated with the dimensions l and d. For the bar shaped GMR or TMR element, still the section line A-A is representative of the cross sections of the GMR element 800 of FIG. 8.

Figure 10:
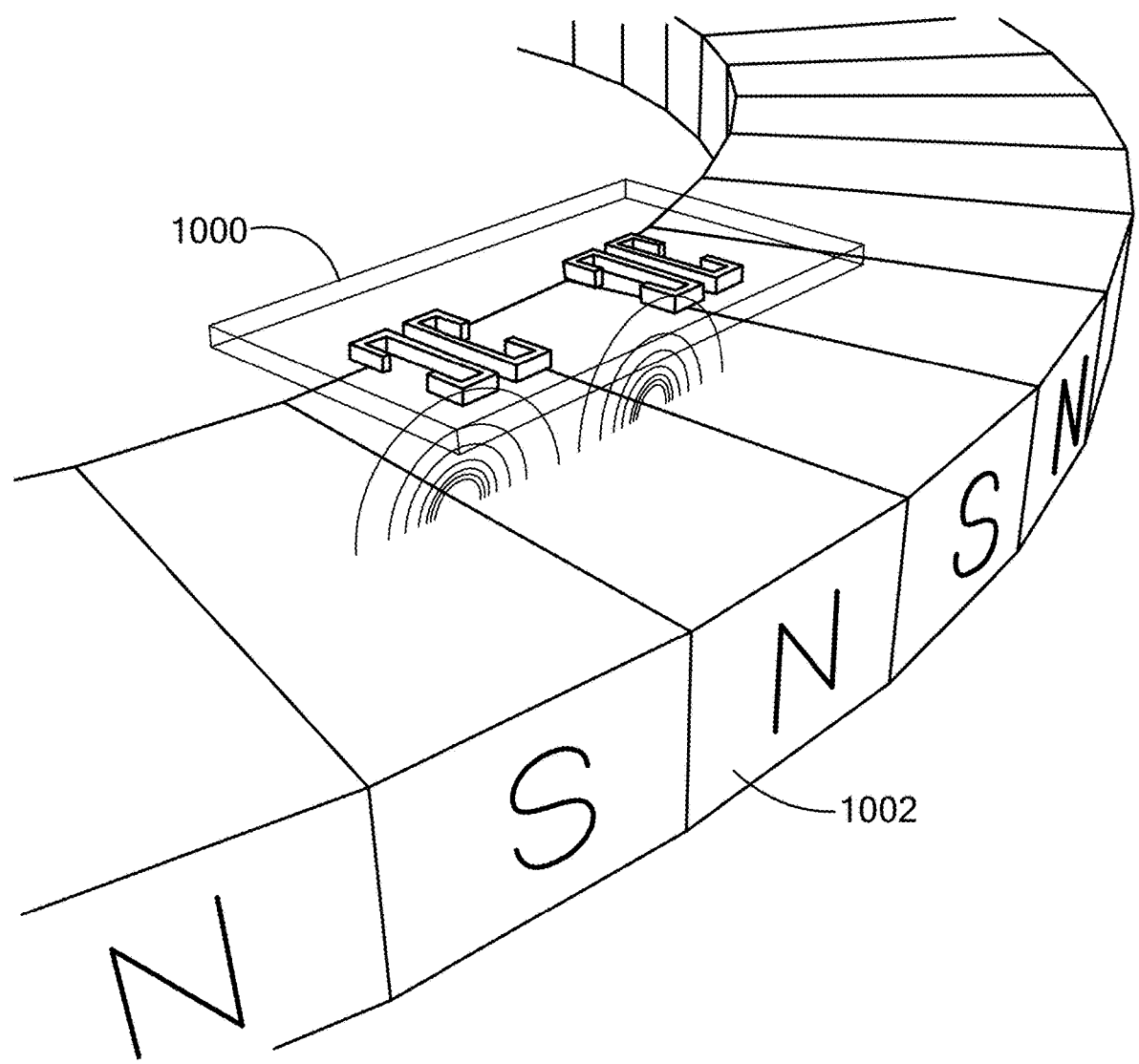
FIG. 10 is a block diagram of a magnetoresistance element magnetic field sensor placed above a magnetic target for rotation speed measurement.

Referring now to FIG. 10, a magnetic field sensor 1000 can include one or more magnetoresistance elements. Here, four magnetoresistance elements, which can be of a type described above in conjunction with FIG. 8. The four magnetoresistance elements can be arranged in a bridge. Other electronic components (not shown), for example, amplifiers and processors, i.e., an electronic circuit, can also be integrated upon the common substrate. In some embodiments, the electronic circuit can generate an output signal indicative of a movement, e.g., a rotation, of an object. e.g., 1002.

A surrounding package (not shown) e.g., a plastic package, can surround or otherwise be included with the magnetic field sensor 1000. Also, a leadframe (not shown) can be coupled to or otherwise be included with the magnetic field sensor 1000.

The magnetic field sensor 1000 can be disposed proximate to a moving magnetic object, for example, a ring magnet 1002 having alternating north and south magnetic poles. The ring magnet 1002 is subject to rotation.

The magnetic field sensor 1000 can be configured to generate an output signal indicative of at least a speed of rotation of the ring magnet. In some arrangements, the ring magnet 1002 is coupled to a target object, for example, a cam shaft in an engine, and the sensed speed of rotation of the ring magnet 1002 is indicative of a speed of rotation of the target object.

As noted above, example sensors such as those described above, e.g., back-bias sensors and double spin valve stack configurations in which the bias of the spin valve plays the role of the bias generated by the magnet, can be used to obtain angle information. In some embodiments, a spin valve configuration may be less sensitive to stray fields and a single yoke instead of a split yoke.

In aspects, a magnetic field sensor includes back biasing to obtain angular position with respect to a die and target. In some embodiments, a single die is used. In some embodiments, encoding requires first and second targets and first and second sensors. In embodiments, a target has selected shapes for back bias resolver applications that reduce angular error for the sensor as compared with conventional sensors. In embodiments, a target is shaped to reduce harmonics, and thereby, reduce angular error.

Referring again to FIGS. 2, 3A and 3B, a 'left' bridge and a 'right' bridge are shown. For example, FIG. 2 shows a first bridge 210, which can be considered a left bridge, and a second bridge 212, which can be considered a right bridge. In example embodiments, the left bridge 210 output and the right bridge 212 output are provided to a signal processing module, which outputs a target angle signal. It is understood that left and right are relative and example terms that are not to be construed as limiting in any way. In example embodiments, left and right bridges include an element from the bridge center as shown in this figure and the sensor should be at a zero degree orientation.

Figure 10A:
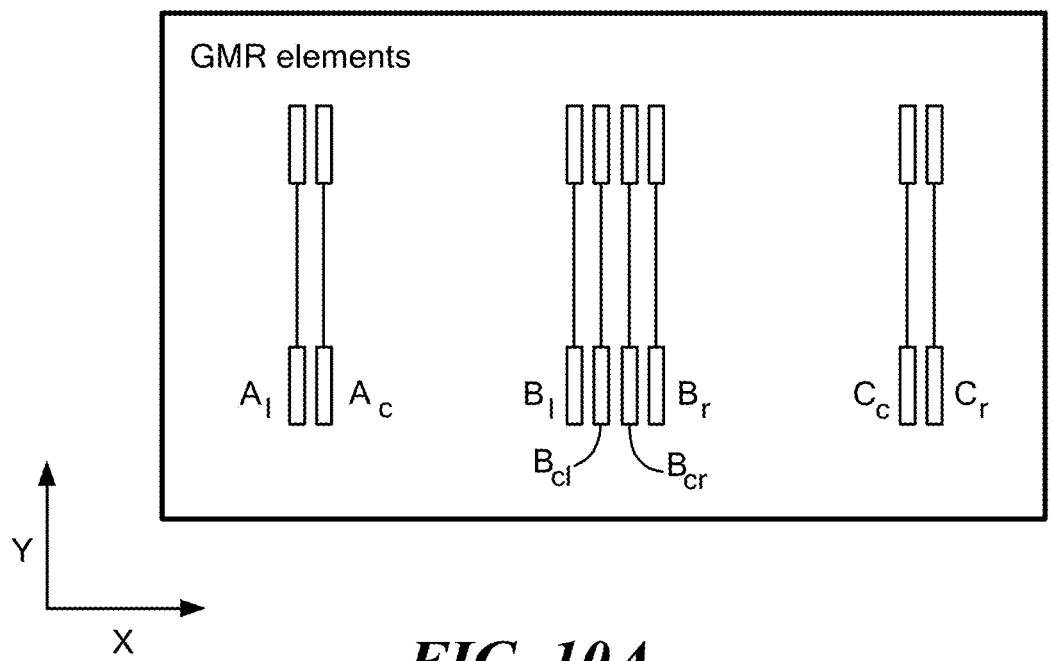
FIG. 10A is a schematic representation of a portion of a sensor having magnetic field sensing elements and FIG. 10B shows a circuit representation of left and right bridges formed by the magnetic field sensing elements of FIG. 10A.
Figure 10B:
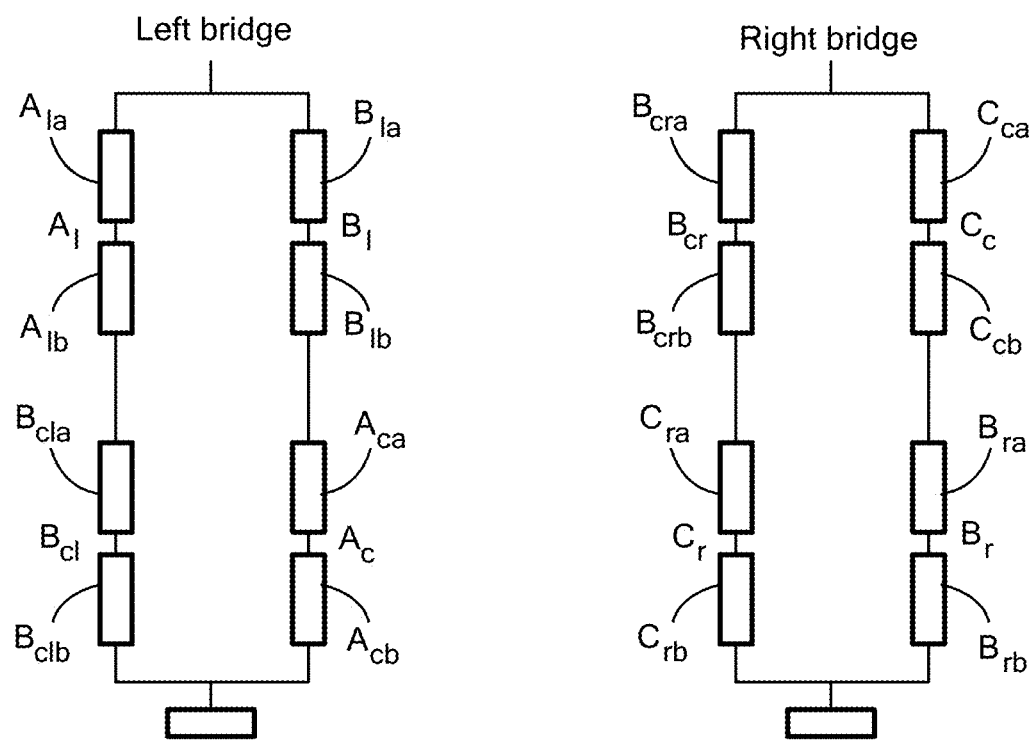

For example, FIG. 10A shows a sensor having GMR elements and FIG. 10B shows an alternative bridge construction in which GMR elements are subject to opposite bias. FIG. 10A shows first and second GMR bridges each having four elements where each element has first and second segments. Output signals in the left and right bridges can be used to determine speed and direction information. In one embodiment, subtraction and sum of signals in the left and right bridges outputs speed and direction information. In some embodiments, sine and cosine information can be generated, as described more fully below. The GMR elements are labeled such that subscription 1 refers to left, r refers to right, and c refers to center. Looking to FIG. 10A, yokes Ax and Cx may be referred to an outer yoke Bx may be referred to as central or inner yokes. From left to right in FIG. 10A, the GMR elements are listed as $A_l$, $A_c$, $B_l$, $B_{cl}$, $B_{cr}$, $B_r$, $C_c$, $C_r$. As seen in the left bridge of FIG. 10B, GMR element Ai includes first and second segments $A_{la}$, $A_{lb}$, the GMR element $B_{cl}$ includes third and fourth elements $B_{cla}$, $B_{clb}$, and so on.

In this arrangement, the segments of the GMR elements do not experience the exact same bias conditions. This is why the vertical spacing between top and bottom pieces of GMR is not the same for outer elements and inner elements. This compensates for this sensitivity issue and may bring back stray field immunity. For example, the bias field, which can be generated by a magnet, along Y axis (FIG. 10A) varies slightly between inner and outer yoke. This produces a difference in sensitivity of the elements, resulting in a global sensitivity to common mode field.

In an example embodiment, left bridge 210 output (Left) and the right bridge 212 output (Right) are combined to generate sine and cosine signals as follows:

Sine=Left−Right

Cosine=Left+Right

Once these signals are normalized, the following operation leads to the measurement of the angle φ of the target within a period of this same target:

$$\varphi = \tan^{-1}\left(\frac{\text{Sine}}{\text{Cosine}}\right)$$

U.S. Pat. No. 7,714,570, which is incorporated herein by reference, discloses an angle sensor utilizing arc tangent of sine and cosine information to generate angular position information.

Figure 11A:
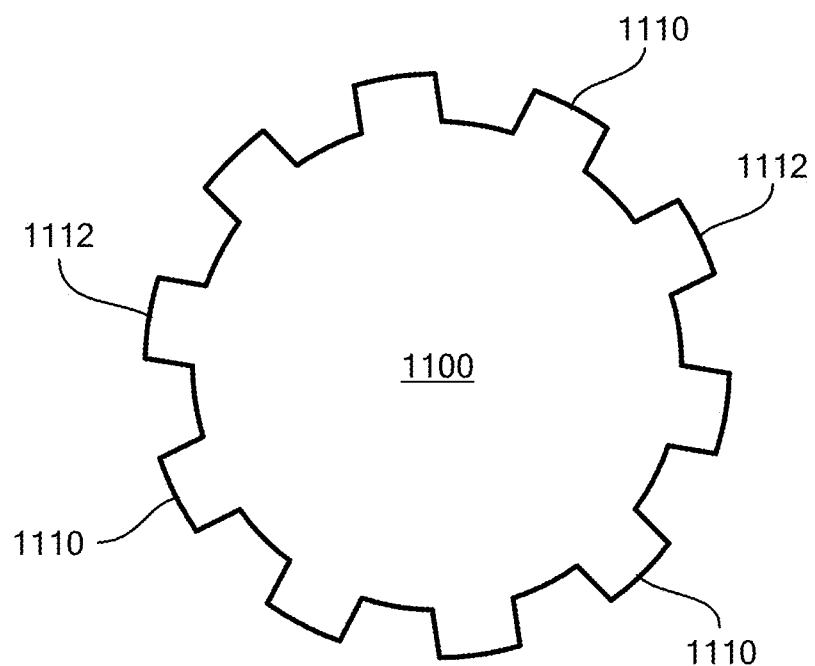
FIG. 11A shows a target having a rectangular gear teeth.
Figure 11B:
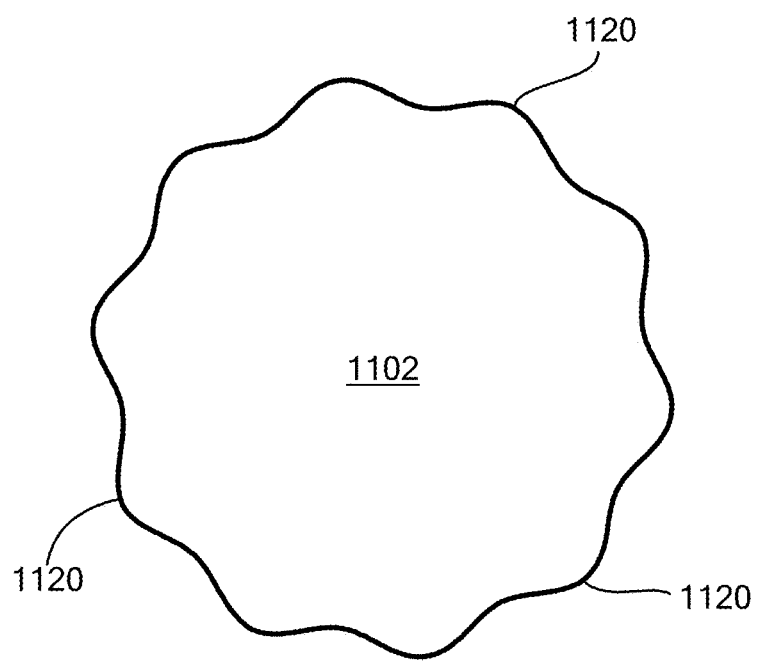
FIG. 11B shows a target having sinusoidal gear teeth.

FIG. 11A shows a first target 1100, which can have some similarity with the target 402 in FIG. 4, having a first shape and FIG. 11B shows a second target 1102 having a second shape. As described more fully below, shapes of the first and second targets 1100, 1102 facilitate resolving target angle.

The first target 1100 comprises a target having substantially square teeth 1110. In an example embodiment, square refers to a given tooth having a substantially cylindrical outer face 1112 with sides that are substantially radial, such as can be seen in FIG. 4.

The second target 1102 has sinusoidal teeth 1120. In an example embodiment, a profile of the second target 1102 is defined as follows:

$$R(\theta) = R_0 + \frac{\delta R}{2} \times [1 - \cos(n\theta)]$$

where:
$R_0$ is the outer radius of the target
$\delta R$ is the valley depth
n is the number of teeth
θ is the angle of the target in a range of 0 degrees to 360 degrees.

Figure 12A:
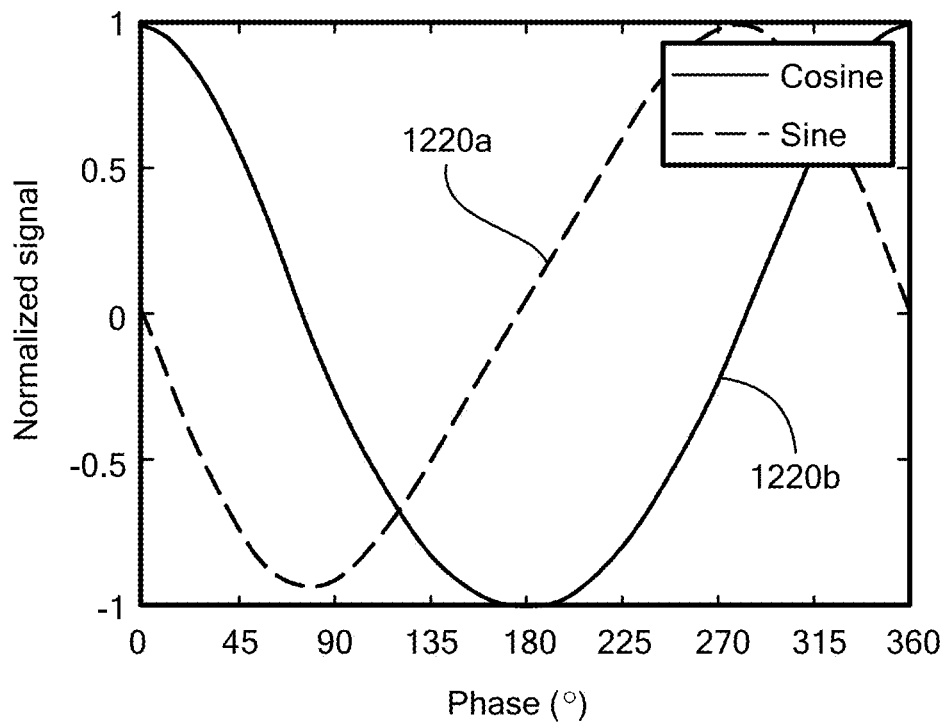
FIG. 12A is a waveform diagram of sine and cosine signals for a sensor for the target of FIG. 11A.
Figure 12B:
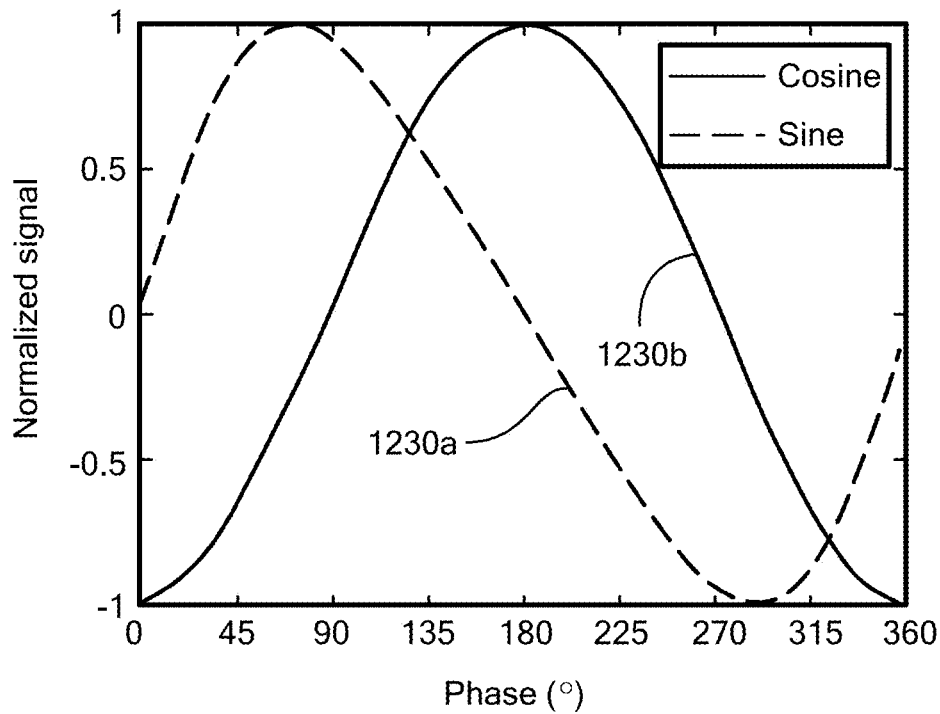
FIG. 12B is a waveform diagram of sine and cosine signals for a sensor for the target of FIG. 11B.
Figure 13A:
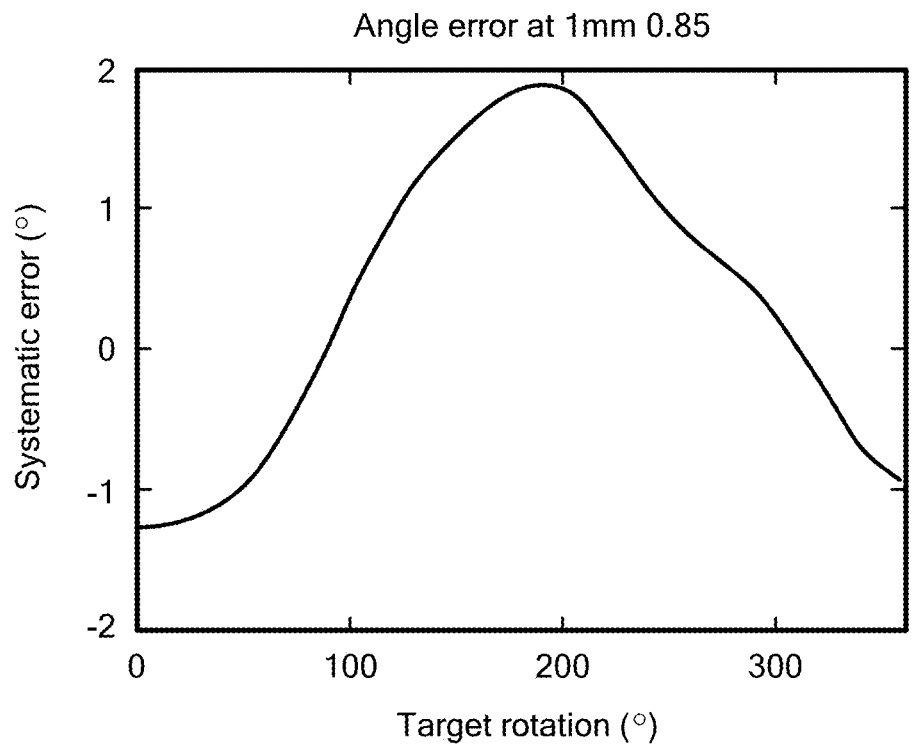
FIG. 13A is a plot of angle error for the target of FIG. 11A.
Figure 13B:
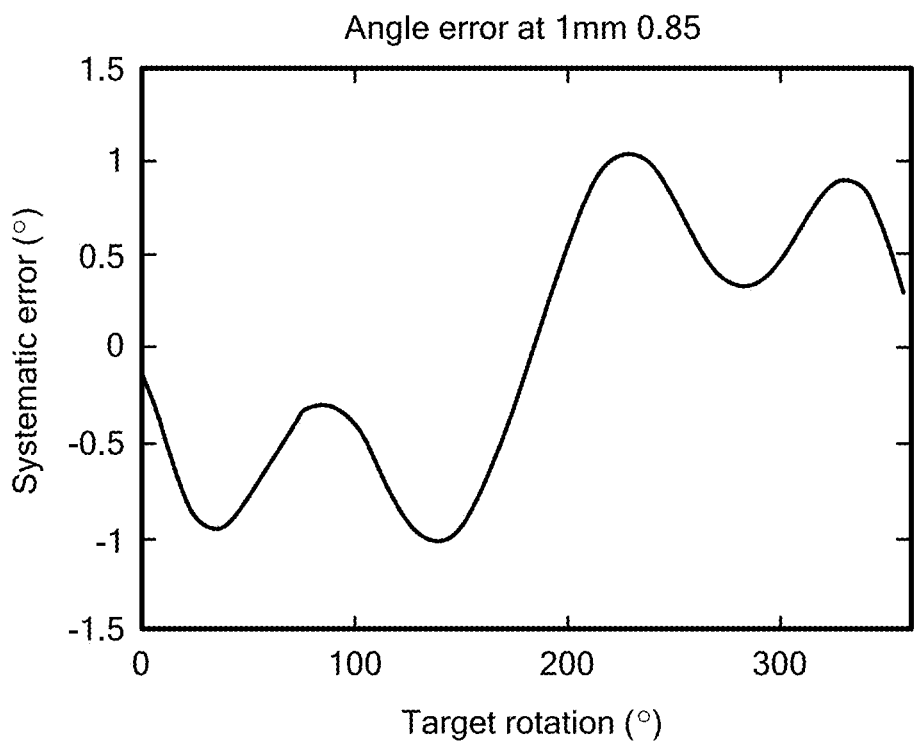
FIG. 13B is a plot of angle error for the target of FIG. 11B.

FIG. 12A shows illustrative sine and cosine signals 1220a,b obtained from an example sensor positioned in relation to a square tooth target, such as the first target 1100 of FIG. 11A. The target 1100 has nine teeth and has a 1 mm air gap with the sensor IC. FIG. 13A shows example angle error for the first target 1100 of FIG. 11A, FIG. 12B shows illustrative sine and cosine signals 1230a,b obtained from an example sensor positioned in relation to a sinusoidal profile target, such as the second target 1102 of FIG. 12B. FIG. 13B show an illustrative angular error obtained for a nine teeth target having a sinusoidal profile.

Figure 14:
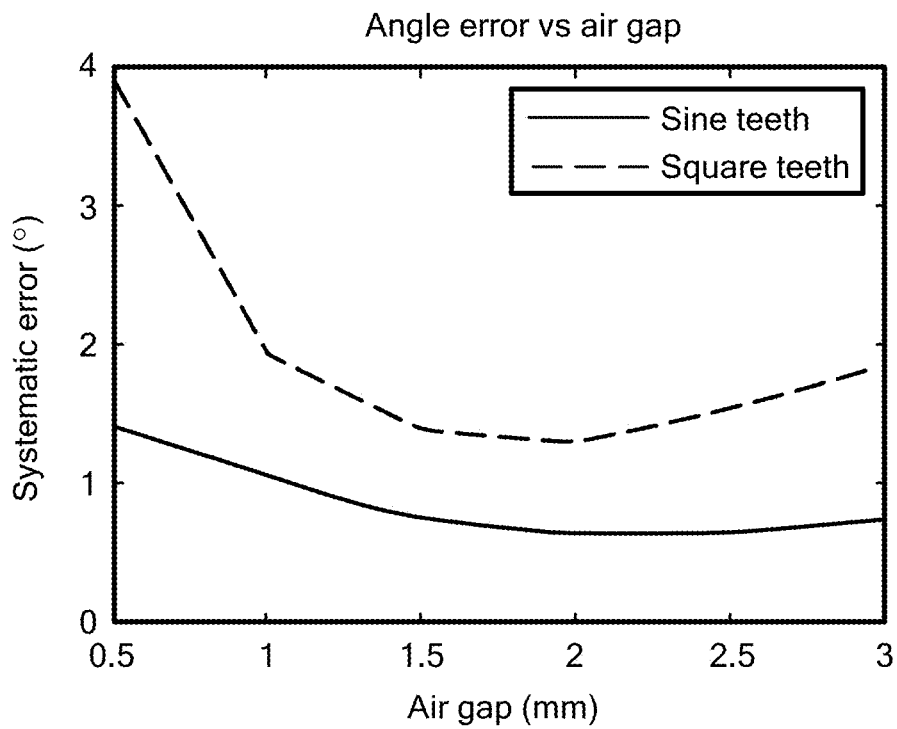
FIG. 14 is a plot of angle error versus air gap for the targets of FIGS. 11A and 11B.

As can be seen in FIG. 14, the sine tooth target 1102 (FIG. 11B) generates a lower angular error than the square tooth target 1100. It can also be seen that the higher the air gap, the better the angular error for the sine tooth target. It should be noted that the air gap with the sensor should be small to maximize signal.

The angular error shown on FIG. 13B shows that the error figure follows a harmonic distribution.

Figure 15:
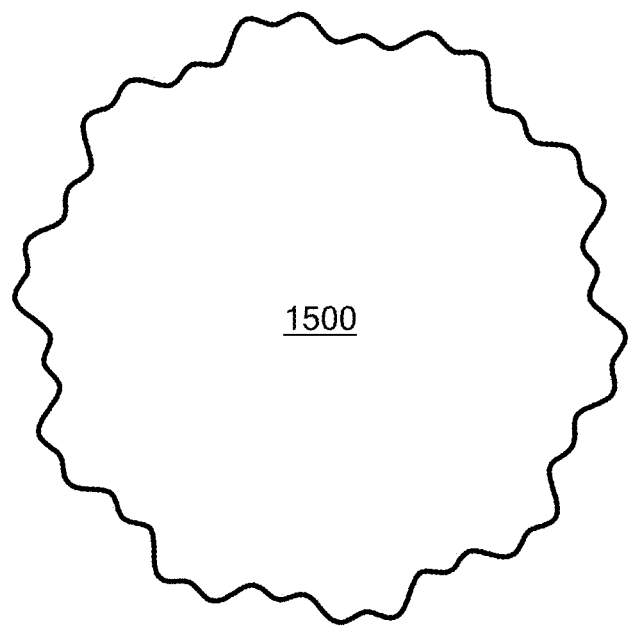
FIG. 15 shows a side view of a target having a sinusoidal profile with second and fourth harmonic reduction.

FIG. 15 shows an example target 1500 having a profile that includes harmonics so as to reduce angular error. An example target profile can be defined as:

$$R(\theta) = R_0 + \sum_{h=0}^{N} \frac{\delta R_h}{2} \times [1 - \cos(n(h+1)\theta)] - \max\left(\sum_{h=0}^{N} \frac{\delta R_h}{2} \times [1 - \cos(n(h+1)\theta)]\right)$$

$R_0$ is the outer radius of the target
$\delta R$ is the valley depth
n is the number of teeth
θ is the angle
h is the harmonic index.
$R_h$ is the amplitude of the h-th harmonic.

It is understood that selecting the number of harmonics corresponds to the number of shapes that can be provided, as well as the improvement in harmonic reduction. FIG. 15 is an example with a given number of harmonics ($1^{st}$, $2^{nd}$ and $4^{th}$).

In some embodiments, first and second harmonics are used to generate a target with $1^{st}$ and $2^{nd}$ harmonic profiles combined. One can calculate the angle error for different harmonic amplitudes (meaning harmonic profile radii) and plot a graph similar to FIG. 16 but with $1^{st}$ harmonic amplitude in X, $2^{nd}$ harmonic amplitude in Y, and angle error in color scale. Then one can select the conditions at which the angle error is at a minimum.

In some embodiments, the use of a sinusoidal profile may make it easier to see that the angle error is composed of harmonic components. If the target profile can be described with one single sine (e.g., FIG. 11B), then the angle error will have a profile that is a combination of this sinus with the given period. It is understood that a square profile (e.g., FIG. 11A) can be decomposed in a sum of an infinity of sine harmonics of the fundamental period. Then the angle error is a combination of harmonics of all these harmonics.

It should be noted that with sinusoidal functions, one can reproduce any shape of tooth for a relatively large number of harmonics. It will be appreciated that as the error is harmonic it may be faster to determine a 'good' correction by tuning the a of the dominant harmonic of the error.

Figure 16:
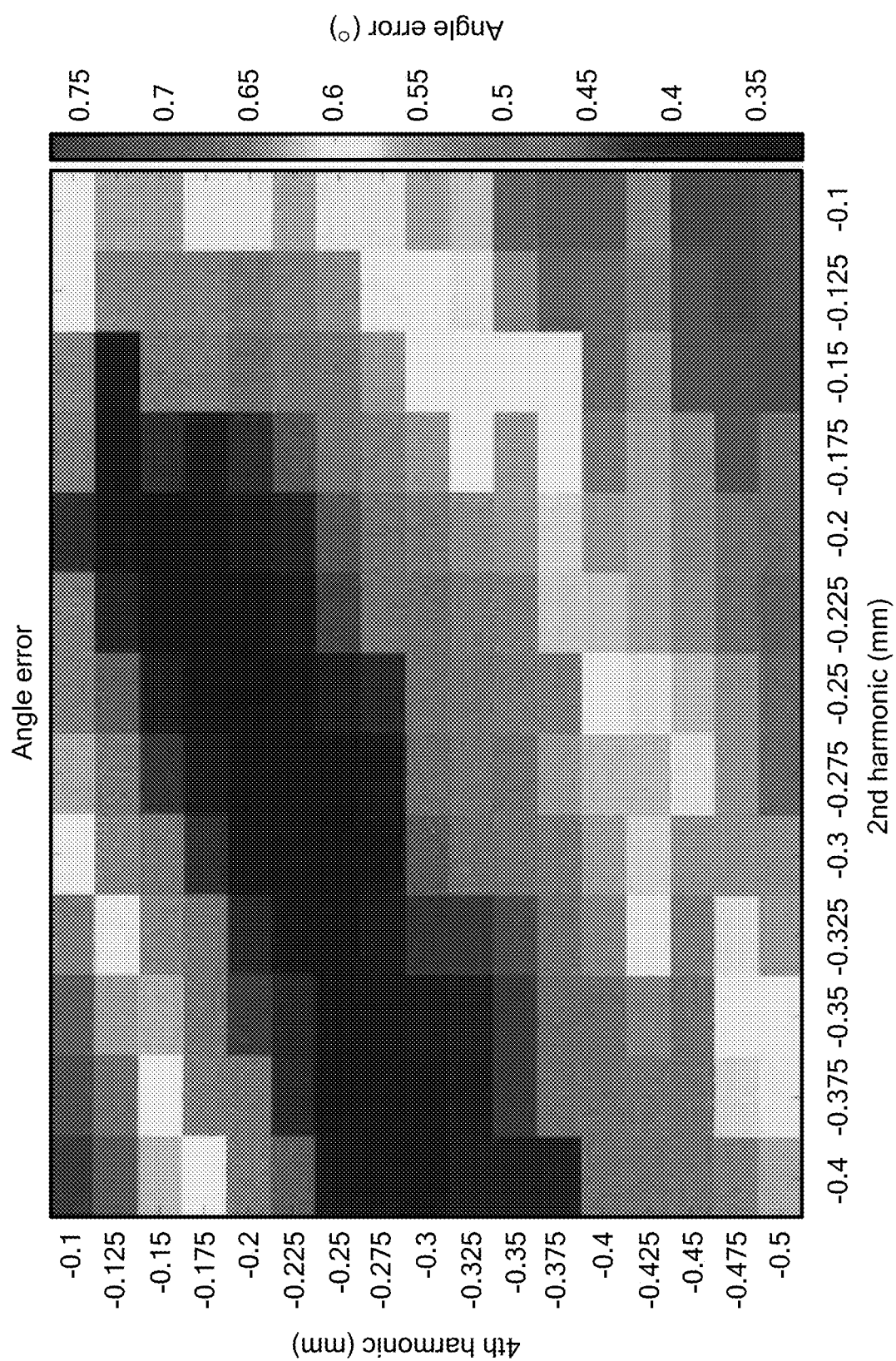
FIG. 16 is a graphical representation of angle error for the second and fourth harmonics.

FIG. 16 shows the effect of adding second and fourth harmonics to a target profile. As can be seen, it shows the maximum angular error over a period for different values of the amplitude of the second and fourth harmonics $R_2$ and $R_4$. By tuning these harmonics, the maximum error is reduced by a factor of about three. It is understood that FIG. 16 provides a tool to facilitate determining a profile for a target. For example, error minimization can be run over harmonics amplitude to determine a target profile, such as the profile of the target in FIG. 15. It is understood that the target shape, such as the target of FIG. 15, depends on the magnet shape, the distance between the magnet and the die and the distance between the die and the target.

Figure 17:
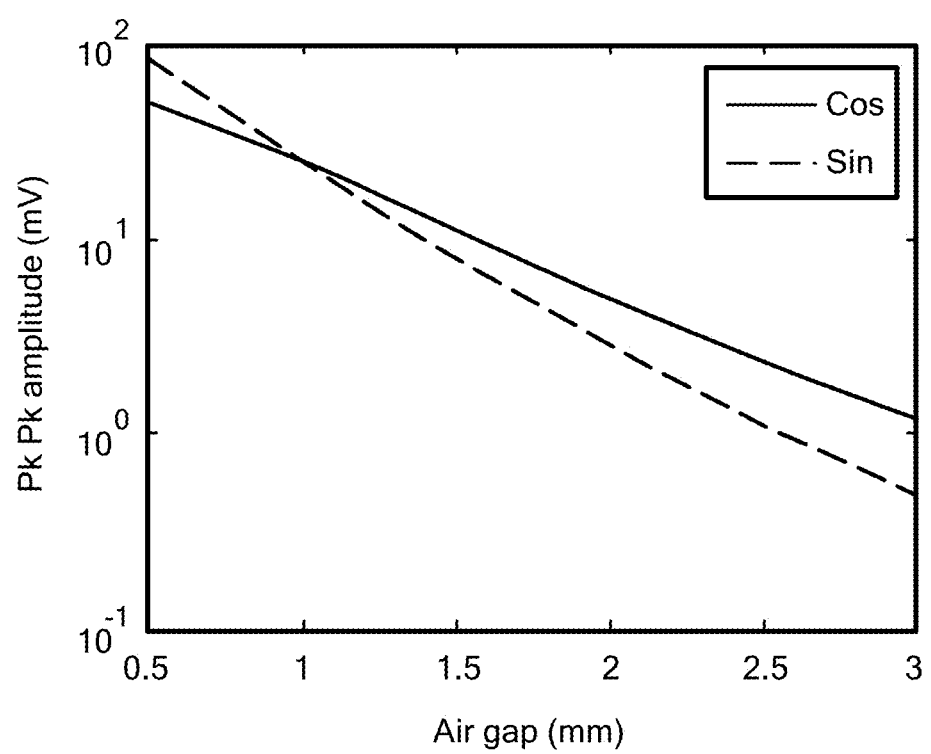
FIG. 17 is a plot of sine and cosine signals for amplitude versus air gap.

In addition, example embodiments of the sensor can obtain relatively similar amplitudes on the sine and cosine waveforms. FIG. 17 shows how the amplitude of the sine and cosine waveforms vary with air gap. As can be seen, at about 1 mm air gap, the amplitude of the sine and cosine signals is the same. This crossover air gap can be selected by adjusting the target period length in relation with the element spacing on the die, for example. The target period corresponds to a certain length on the die, which is the target period length. To obtain the same amplitude on sine and cosine, then the left and right bridges centers should be distant from each other by 90°, meaning ¼ of the target period length.

To obtain sine and cosine of the same amplitude, a 90° phase shift is implemented between the left and right bridge outputs. The orthogonality comes from the mathematics of adding and subtracting phase shifted sinusoidal signals. The 90° phase shift is determined from trigonometric relationships in a manner similar to obtaining the same amplitude on sine and cosine. For example, assume left bridge varies as cos(wt+phi) and right bridge varies as cos wt−phi) where w is the pulsation, t is the time and phi is the phase shift between the left and right bridges. Then:

Left+right=cos(*phi*)cos(*wt*)

Left−right=sin(*phi*)sin(*wt*)

Orthogonality is provided as the sum provides cos(wt) and the subtraction provides sin(wt). Also to get the same amplitude we need cos(phi)=sin(phi), therefore phi=45°.

Figure 18:
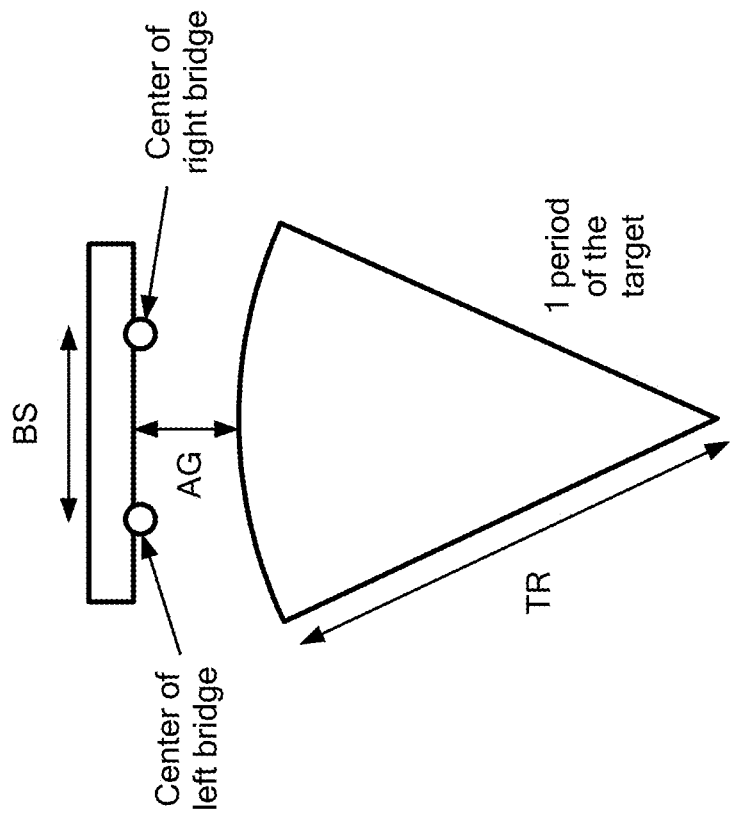
FIG. 18 is a schematic representation showing the location of bridge elements and a target.

In an example embodiment, and shown in FIG. 18, the system can be defined in accordance with the following equation:

$$\frac{BS}{2(TR+AG)} = \tan\left(\frac{90°}{2n}\right)$$

where:
BS is the distance between the centers of left and right bridges
TR is the outer radius of the target
AG is the air gap
n is the number of periods in the target In another aspect, a magnetic resolver sensor includes a spacer to position a magnet a selected distance from the sensing element. The selected distance should provide sufficient flux to obtain good signal quality and ensure that the sensing signal is sinusoidal. The distance should also avoid excessive influence on the signal from the surface topology of what is being sensed while ensuring that airgap changes have reduced impact on the amount of absolute field offset to the dynamic response.

Figure 19:
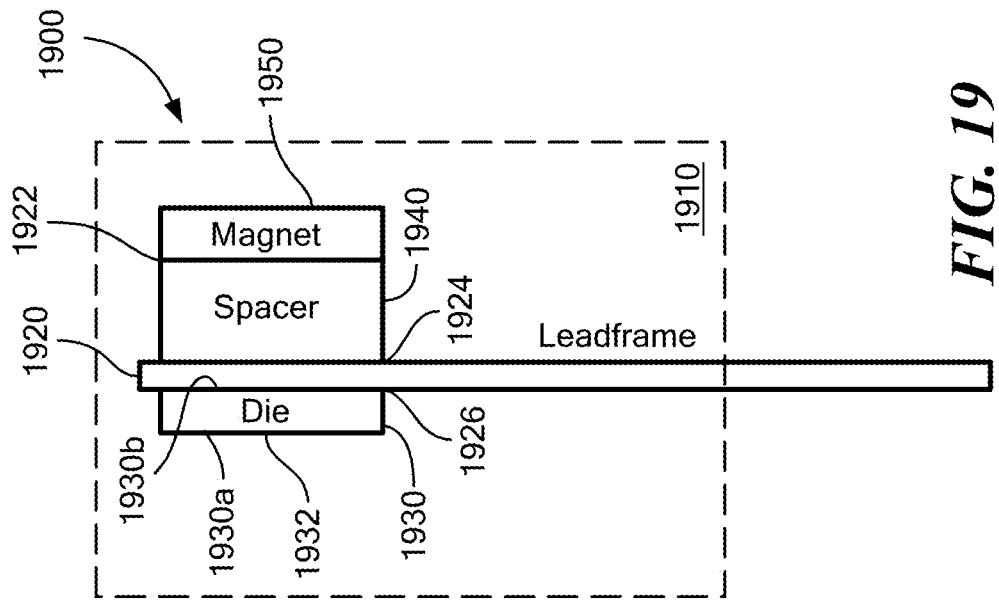
FIG. 19 is a simplified cross-sectional view of a magnetic field sensor integrated circuit (IC), according to an embodiment of the present disclosure.

Referring to FIG. 19, a simplified cross-sectional view of a magnetic field sensor 1900 is shown, implemented as an integrated circuit (IC) 1910. The sensor integrated circuit (IC) 1910 includes a lead frame 1920 comprising a plurality of leads, a substrate 1930 attached to the lead frame 1920, a magnet 1950, and a spacer 1940 positioned between the lead frame 1920 and the magnet 1950. The substrate 1930 can be any appropriate structure and material to support at least a magnetic field sensing element 1932, such as a semiconductor die. At least a portion of the lead frame 1920 extends exterior of the IC package 1910 to permit connections (e.g., supply voltage, ground, and/or output connections) to the IC package 1910.

A dashed-line box represents the IC package 1910, for example as may be formed by over-molding with a non-conductive mold material, with only a portion of the lead frame 1920 accessible from exterior of the IC package 1910. For example, the package 1910 can be comprised of a non-conductive mold material formed to enclose the semiconductor die 1930, the spacer 1940, the magnet 1950, and a portion of the lead frame 1920. The die 1930 can comprise a substrate having a first surface 1930a supporting at least a magnetic field sensing element 1932 and a second, opposing surface 1930b attached to the lead frame 1920. Electrical Connections (e.g., as may take the form of wire bonds) can be provided between the die 1930 and the lead frame 1920 within the molded package 1910.

The magnet 1950 is configured to generate a magnetic field and the magnetic field sensing element 1932 is configured to generate a magnetic field signal indicative of movement of a target object (not shown) proximate to the IC package 1910. The magnet 1950 may be comprised of a hard ferromagnetic or simply hard magnetic material (i.e., a permanent magnet such as a segmented ring magnet) to form a back bias magnet and may be formed by sintering or molding for example.

The spacer 1940 is positioned between the magnet 1950 and the lead frame 1920 and in particular is attached to a surface of the lead frame 1920 opposite the surface to which the die 1930 is attached, as shown. The thickness of the spacer 1940 is selected to establish a predetermined distance between the magnet and the magnetic field sensing element. Further, by providing an integrated circuit package 1910 enclosed by a non-conductive mold material, the placement of the magnet 1950, the spacer 1940, and the substrate 1930 with respect to each other is precise and fixed.

The predetermined distance between the magnet 1950 and the magnetic field sensing element 1932 can be selected to provide the magnetic field signal as a sinusoidal signal. It will be appreciated that decreasing the predetermined distance too much (i.e., making the magnet and the magnetic field sensing element too close to each other) can result in deformation of the sinusoidal signal, while increasing the predetermined distance too much (i.e., providing the magnet and the magnetic field sensing element too far apart) can result in a weak magnetic field signal that can be difficult to detect and process accurately. For example, if the magnet 1950 and magnetic field sensing element 1932 are too close to each other, the target is a square-tooth gear, and is sufficiently close to the sensor then the signal will start to track a square shape, significantly deformed from the sinusoidal. Thus, the predetermined distance is selected to achieve a sufficiently strong magnetic field signal, however without deforming the sinusoidality (i.e., the extent to which the signal follows a nominal sinusoidal function) of the magnetic field signal or at least with less than a predetermined amount of deformation. The target shape can be taken into account to still further reduce the deformation and/or improve the quality of the sinusoidal signal.

The thickness of the spacer 1940, and thereby the predetermined distance between the magnetic field sensing element 1932 and the magnet 1950, is selected to provide the magnetic field signal as a sinusoidal signal having less than a predetermined amount of deformation and/or having a predetermined minimum peak-to-peak signal level. The amount of deformation can be determined by determining the Fourier transform of the magnetic field signal and the resulting harmonic coefficients. Another way to determine the amount of deformation of the magnetic field signal is to generate an error curve by comparing and taking difference values between a predetermined nominal sinusoidal signal and the measured magnetic field signal and considering the maximum error (i.e., the largest deviation) between the signals. It will be appreciated that various factors affect the tradeoff between deformation of the magnetic field signal from a "perfect" sinusoid and signal strength. Optimization of these conflicting requirements can be achieved by sizing the spacer 1940 so that a ratio of the thickness of the spacer to a thickness of the magnet can be selected to provide the magnetic field signal with a predetermined minimum peak-to-peak signal level and/or with less than a predetermined amount of deformation for a given package size and airgap (i.e., nominal distance between the magnetic field sensing element 32 and the target). In other words, once the maximum combined thickness of the magnet 1950 and spacer 1940 is determined based on the size of the IC package 1910 for the given application, the ratio of spacer thickness to magnet thickness is selected to achieve the desired magnetic field signal level and deformation results.

The spacer 1940 can be comprised of a material having a magnetic permeability approximately equal to air. For example, the spacer 1940 can be a copper material or aluminum material, or any other material having a magnetic permeability approximately equal to air. In an example embodiment, the spacer can have a thickness of approximately 2.4 millimeters (mm), and the predetermined distance between the magnet and the magnetic field sensing element is approximately 3.2 mm.

In some embodiments, a first attachment mechanism 1922 can be disposed between the spacer 1940 and the magnet

1950, a second attachment mechanism 1924 can be disposed between the spacer 1940 and the lead frame 1920, and a third attachment mechanism 1926 can be disposed between the die 1930 and the lead frame 1920. The first, second, and third attachment mechanisms 1922, 1924, 1926 can comprise one or more of a conductive or non-conductive adhesive, epoxy, a tape, a film, a spray, or solder. Any other form of mechanical attachment can be provided.

Figure 20A:
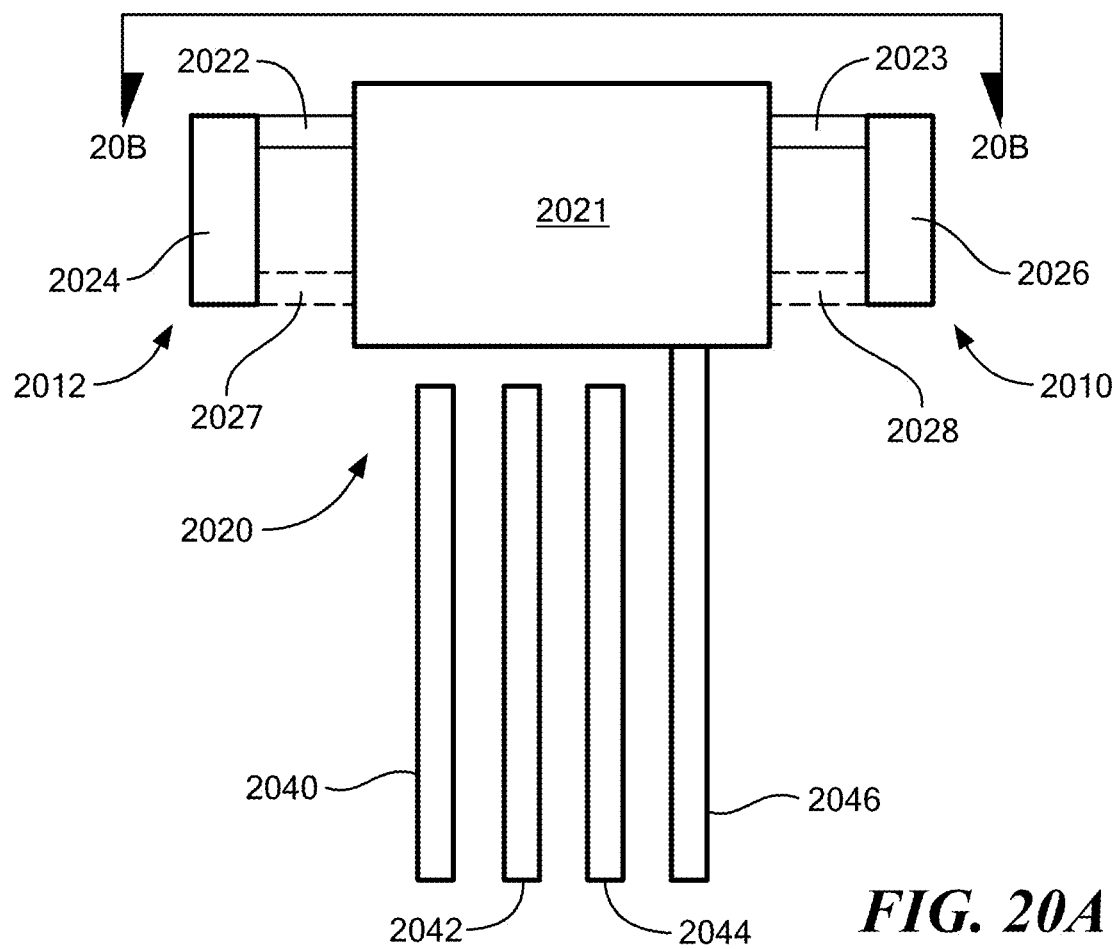
FIG. 20A is a top view of a lead frame including ears prior to being bent that, when bent, provide a spacer between a magnet and a die, according to an embodiment of the present disclosure.

FIG. 20A is a top view of an alternative lead frame 2020 including ears 2010, 2012 prior to being bent that, when bent, provide a spacer between a magnet and a die for use in a further magnetic field sensor IC embodiment.

Figure 20B:
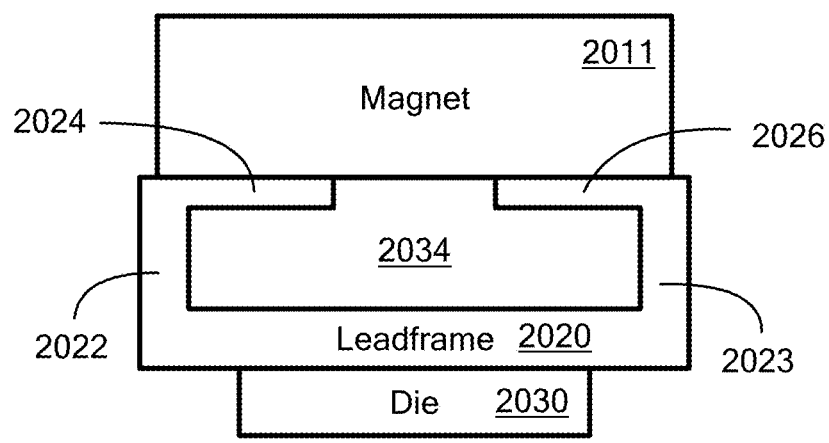
FIG. 20B is a side view of the lead frame of FIG. 20A in a magnetic field sensor assembly.

Lead frame 2020 can include a die attach portion 2021 to support a substrate, or die (shown in FIG. 20B). Lead frame ears 2010, 2012 can each have a first portion 2022, 2023 extending from the die attach portion 2021 of lead frame 2020 and a second portion 2024, 2026 extending, respectively, from the first portion. Note that each of the ears 2010, 2012 can further include a third portion 2027, 2028 (shown in dotted line) to further support the magnet. As shown in FIG. 20B, the ears 2010 and 2012 can be bent to form a spacer 2034 between the die attach portion 2021 of the lead frame 2020 (and, thus, the die 2030) and the magnet 2011.

The lead frame 2020 can comprise a plurality of leads 2040, 2042, 2044, 2046, with at least one of the leads (lead 2046 in this embodiment) directly connected to the die attach portion 2021 of lead frame 2020. One or more other leads 2040, 2042, 2044 can be coupled to the die with wire bonds (not shown). In some embodiments, a different lead, more than one lead, or all of the leads may be directly connected to the die attach portion 2021.

FIG. 20B is an end view of the lead frame 2020 and of FIG. 20A in assembly with a die 2030 and magnet 2011, as taken along line 20B-20B of FIG. 20A (after the ears of the lead frame have been bent to form the spacer). The spacer 2034 formed between the magnet 2011 and the die 2030 can comprise air or may be filled with a suitable material having a permeability greater than or equal to that of air.

To arrive at the structure of FIG. 20B, the ears 2010, 2012 of the lead frame 2020 are bent at both ends of first portion 2022, 2023, and then the magnet 2011 can be placed on the second portions 2024, 2026 of ears 2010, 2012 to form spacer 2034. The die 2030, although not shown in FIG. 20A, may be positioned on the side of the lead frame 2020 opposite the magnet, as shown in FIG. 20B. It will be appreciated that the spacer 2034 establishes a predetermined distance between the magnet 2011 and the die 2030 (and more specifically, the sensor on the die 2030), which predetermined distance can be selected to provide the magnetic field signal as a sinusoidal signal, as explained in connection with FIG. 19 above. More specifically, the length of the first portion 2022, 2023 of respective ears 2012, 2010 establishes the distance between the die 2030 and magnet 2011, as shown.

Figure 20C:
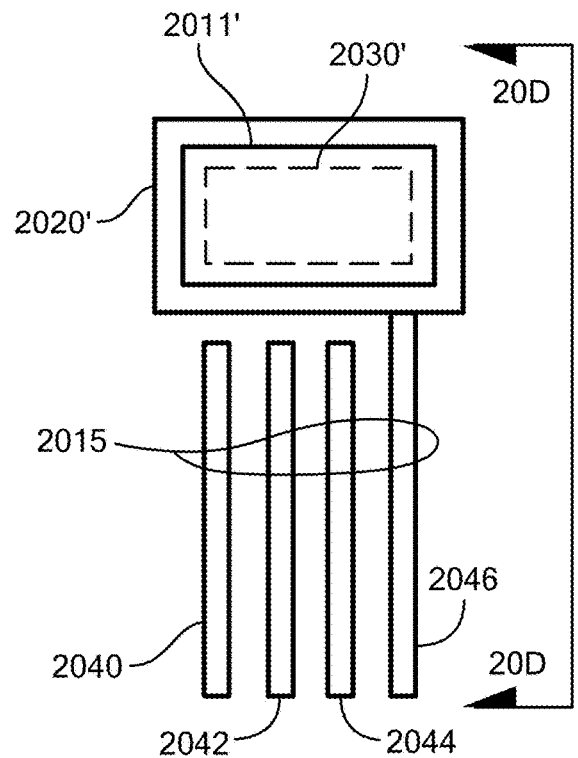
FIG. 20C is a top view of a lead frame having a thickened portion between a magnet and a die to provide a spacer between the magnet and the die, according to an embodiment of the present disclosure.

FIG. 20C is a top view of a further alternative lead frame 2020' having a thickened portion between a magnet 2011' and a die 2030' to thereby provide a spacer between the magnet and the die, according to a further embodiment. The lead frame 2020' has a magnet 2011' attached to a first surface and a die 2030' (i.e., substrate that supports a magnetic field sensing element) attached to a second, opposing surface (shown in dotted-line in FIG. 20C, as it is positioned underneath the lead frame 2020').

The lead frame 2020' can comprise a plurality of leads 2040, 2042, 2044, and 2046, with at least one of the leads (lead 2046 in this embodiment) directly connected to a die attach portion of the lead frame 2020'. One or more other leads 2040, 2042, 2044 may be coupled to the die with wire bonds (not shown). In some embodiments, a different lead, more than one lead, or all of the leads may be directly connected to the lead frame 2020'.

Figure 20D:
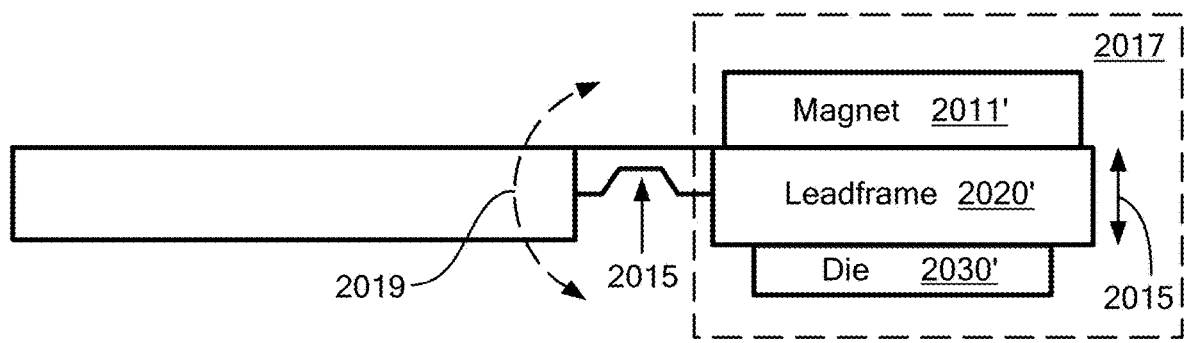
FIG. 20D is a side view of the lead frame of FIG. 20C in a magnetic field sensor assembly.

FIG. 20D is a side view of the lead frame and die assembly of FIG. 20C, as taken along line 20D-20D of FIG. 20C. The lead frame 2020' supports the magnet 2011' on a first surface and the die 2030' on a second, opposing surface. Lead frame 2020' can have a thickened portion between the magnet 2011' and the die 2030' to provide the necessary distance (2005) between the magnet 2011' and the die 2030', according to an embodiment of the present disclosure. It will be appreciated that the thickness 2005 of the lead frame 2020' provides a specific predetermined distance between the magnet 2011' and the die 2030' (and, more specifically, between the magnet 2011' and the magnetic field sensing element on the die 2030'), which predetermined distance can be selected to provide the magnetic field signal as a sinusoidal signal, as explained in connection with FIG. 19 above.

The lead frame 2020' and die 2030' may be formed as part of an IC package in which the die 2030', magnet 2011', and a portion of the lead frame 2020' are enclosed by a non-conductive mold material 2013. Leads 2040, 2042, 2044, 2046 can comprise a thinner portion 2015 (external to the package) to allow for the leads 2040, 2042, 2044, 2046 to be bent with respect to the package 2017, as shown by arrow 2019.

Figure 21:
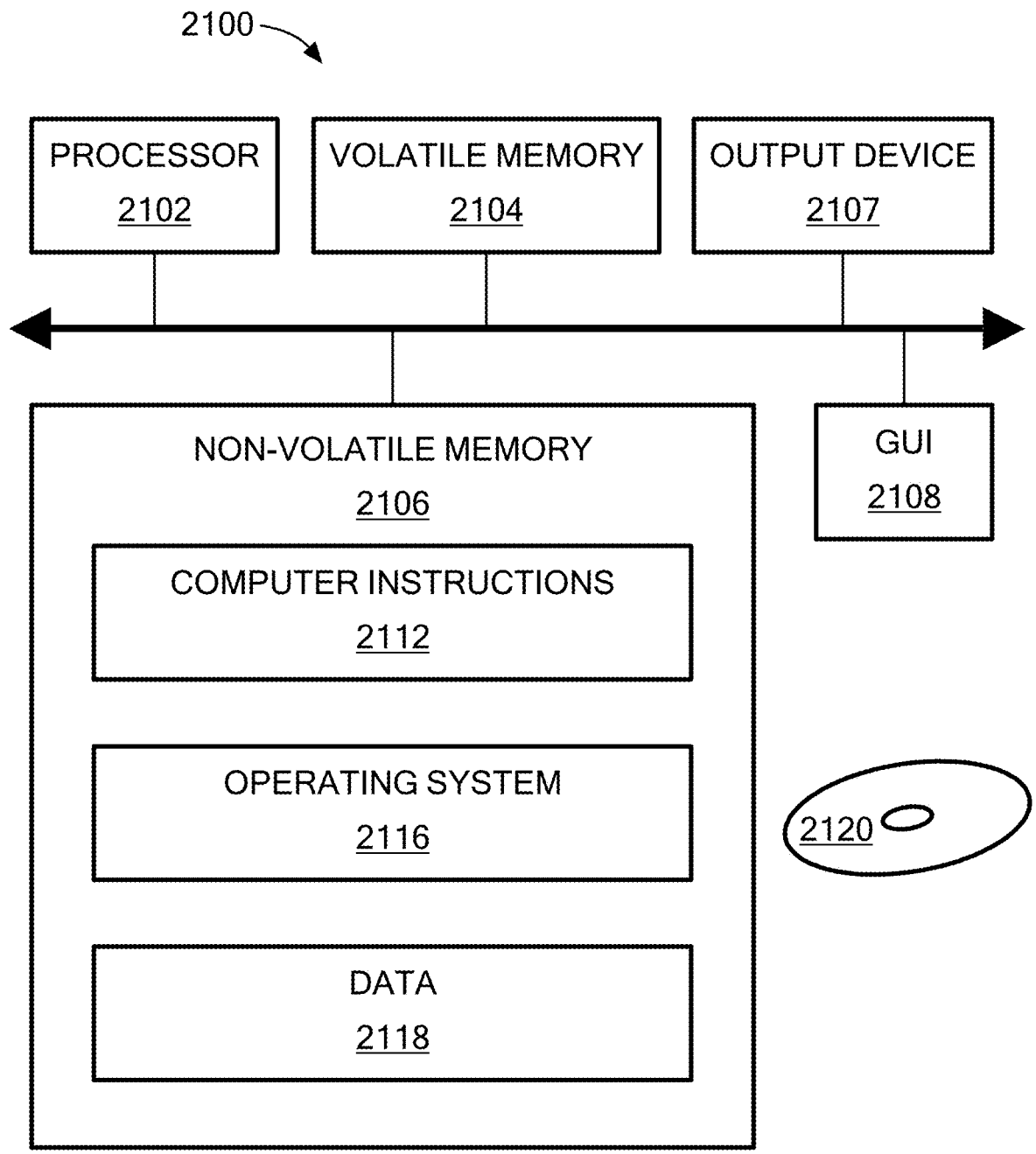
FIG. 21 is a schematic representation of an example computer than can perform at least a portion of the processing described herein.

FIG. 21 shows an exemplary computer 2100 that can perform at least part of the processing described herein. The computer 2100 includes a processor 2102, a volatile memory 2104, a non-volatile memory 2106 (e.g., hard disk), an output device 2107 and a graphical user interface (GUI) 2108 (e.g., a mouse, a keyboard, a display, for example). The non-volatile memory 2106 stores computer instructions 2112, an operating system 2116 and data 2118. In one example, the computer instructions 2112 are executed by the processor 2102 out of volatile memory 2104. In one embodiment, an article 2120 comprises non-transitory computer-readable instructions.

Processing may be implemented in hardware, software, or a combination of the two. Processing may be implemented in computer programs executed on programmable computers/machines that each includes a processor, a storage medium or other article of manufacture that is readable by the processor (including volatile and non-volatile memory and/or storage elements), at least one input device, and one or more output devices. Program code may be applied to data entered using an input device to perform processing and to generate output information.

The system can perform processing, at least in part, via a computer program product, (e.g., in a machine-readable storage device), for execution by, or to control the operation of, data processing apparatus (e.g., a programmable processor, a computer, or multiple computers). Each such program may be implemented in a high level procedural or object-oriented programming language to communicate with a computer system. However, the programs may be implemented in assembly or machine language. The language may be a compiled or an interpreted language and it may be deployed in any form, including as a stand-alone program or as a module, component, subroutine, or other unit suitable for use in a computing environment. A computer program may be deployed to be executed on one computer or on multiple computers at one site or distributed across multiple sites and interconnected by a communication network. A computer program may be stored on a storage medium or device (e.g., CD-ROM, hard disk, or magnetic diskette) that is readable by a general or special purpose programmable computer for configuring and operating the computer when the storage medium or device is read by the computer. Processing may also be implemented as a machine-readable storage medium, configured with a computer program, where upon execution, instructions in the computer program cause the computer to operate.

Processing may be performed by one or more programmable processors executing one or more computer programs to perform the functions of the system. All or part of the system may be implemented as, special purpose logic circuitry (e.g., an FPGA (field programmable gate array) and/or an ASIC (application-specific integrated circuit)).

As used herein, the term "magnetic field sensing element" is used to describe a variety of electronic elements that can sense a magnetic field. The magnetic field sensing element can be, but is not limited to, a Hall effect element, a magnetoresistance element, or a magnetotransistor. As is known, there are different types of Hall effect elements, for example, a planar Hall element, a vertical Hall element, and a Circular Vertical Hall (CVH) element. As is also known, there are different types of magnetoresistance elements, for example, a semiconductor magnetoresistance element such as Indium Antimonide (InSb), a giant magnetoresistance (GMR) element, for example, a spin valve, an anisotropic magnetoresistance element (AMR), a tunneling magnetoresistance (TMR) element, and a magnetic tunnel junction (MTJ). The magnetic field sensing element may be a single element or, alternatively, may include two or more magnetic field sensing elements arranged in various configurations, e.g., a half bridge or full (Wheatstone) bridge. Depending on the device type and other application requirements, the magnetic field sensing element may be a device made of a type IV semiconductor material such as Silicon (Si) or Germanium (Ge), or a type III-V semiconductor material like Gallium-Arsenide (GaAs) or an Indium compound, e.g., Indium-Antimonide (InSb).

As is known, some of the above-described magnetic field sensing elements tend to have an axis of maximum sensitivity parallel to a substrate that supports the magnetic field sensing element, and others of the above-described magnetic field sensing elements tend to have an axis of maximum sensitivity perpendicular to a substrate that supports the magnetic field sensing element. In particular, planar Hall elements tend to have axes of sensitivity perpendicular to a substrate, while metal based or metallic magnetoresistance elements (e.g., GMR, TMR, MTJ, AMR) and vertical Hall elements tend to have axes of sensitivity parallel to a substrate.

As used herein, the term "magnetic field sensor" is used to describe a circuit that uses a magnetic field sensing element, generally in combination with other circuits. Magnetic field sensors are used in a variety of applications, including, but not limited to, an angle sensor that senses an angle of a direction of a magnetic field, a current sensor that senses a magnetic field generated by a current carried by a current-carrying conductor, a magnetic switch that senses the proximity of a ferromagnetic object, a rotation detector that senses passing ferromagnetic articles, for example, magnetic domains of a ring magnet or a ferromagnetic target (e.g., gear teeth) where the magnetic field sensor is used in combination with a back-biased or other magnet, and a magnetic field sensor that senses a magnetic field density of a magnetic field.

As used herein, the term "accuracy," when referring to a magnetic field sensor, is used to refer to a variety of aspects of the magnetic field sensor. These aspects include, but are not limited to, an ability of the magnetic field sensor to differentiate: a gear tooth from a gear valley (or, more generally, the presence of a ferromagnetic object from the absence of a ferromagnetic object) when the gear is not rotating and/or when the gear is rotating (or, more generally, when a ferromagnetic object is moving or not moving), an ability to differentiate an edge of a tooth of the gear from the tooth or the valley of the gear (or, more generally, the edge of a ferromagnetic object or a change in magnetization direction of a hard ferromagnetic object), and a rotational accuracy with which the edge of the gear tooth is identified (or, more generally, the positional accuracy with which an edge of a ferromagnetic object or hard ferromagnetic object can be identified). Ultimately, accuracy refers to output signal edge placement accuracy and consistency with respect to gear tooth edges passing by the magnetic field sensor.

The terms "parallel" and" perpendicular" are used in various contexts herein. It should be understood that the terms parallel and perpendicular do not require exact perpendicularity or exact parallelism, but instead it is intended that normal manufacturing tolerances apply, which tolerances depend upon the context in which the terms are used. In some instances, the term "substantially" is used to modify the terms "parallel" or "perpendicular." In general, use of the term "substantially" reflects angles that are beyond manufacturing tolerances, for example, within +/−ten degrees.

It is desirable for magnetic field sensors to achieve a certain level or amount of accuracy even in the presence of variations in an air gap between the magnetic field sensor and the gear that may change from installation to installation or from time to time. It is also desirable for magnetic field sensors to achieve accuracy even in the presence of variations in relative positions of the magnet and the magnetic field sensing element within the magnetic field sensor. It is also desirable for magnetic field sensors to achieve accuracy even in the presence of unit-to-unit variations in the magnetic field generated by a magnet within the magnetic field sensors. It is also desirable for magnetic field sensors to achieve accuracy even in the presence of variations of an axial rotation of the magnetic field sensors relative to the gear. It is also desirable for magnetic field sensors to achieve accuracy even in the presence of temperature variations of the magnetic field sensors.

As used herein, the term "processor" is used to describe an electronic circuit that performs a function, an operation, or a sequence of operations. The function, operation, or sequence of operations can be hard coded into the electronic circuit or soft coded by way of instructions held in a memory device. A "processor" can perform the function, operation, or sequence of operations using digital values or using analog signals.

In some embodiments, the "processor" can be embodied in an application specific integrated circuit (ASIC), which can be an analog ASIC or a digital ASIC. In some embodiments, the "processor" can be embodied in a microprocessor with associated program memory. In some embodiments, the "processor" can be embodied in a discrete electronic circuit, which can be an analog or digital.

A processor can contain internal processors or internal modules that perform portions of the function, operation, or sequence of operations of the processor. Similarly, a module can contain internal processors or internal modules that perform portions of the function, operation, or sequence of operations of the module.

It should be understood that electronic functions that may be described below to be analog functions can instead be implemented in digital circuits, in processors, or in modules. For example, it will be recognized that a comparator can be implemented as an analog comparator that compares analog voltages, as a digital comparator that compares digital values, or as a processor or module that compares digital values. Examples shown herein to be analog examples do not limit the scope of described embodiments to be analog embodiments only.

As used herein, the term "predetermined," when referring to a value or signal, is used to refer to a value or signal that is set, or fixed, in the factory at the time of manufacture, or by external means, e.g., programming, thereafter. As used herein, the term "determined," when referring to a value or signal, is used to refer to a value or signal that is identified by a circuit during operation, after manufacture.

As used herein, the term "active electronic component" is used to describe and electronic component that has at least one p-n junction. A transistor, a diode, and a logic gate are examples of active electronic components. In contrast, as used herein, the term "passive electronic component" as used to describe an electronic component that does not have at least one p-n junction. A capacitor and a resistor are examples of passive electronic components.

Having described preferred embodiments, which serve to illustrate various concepts, structures and techniques, which are the subject of this patent, it will now become apparent that other embodiments incorporating these concepts, structures and techniques may be used. Accordingly, it is submitted that the scope of the patent should not be limited to the described embodiments but rather should be limited only by the spirit and scope of the following claims. All references cited herein are hereby incorporated herein by reference in their entirety.

What is claimed is:

1. A magnetic field sensor integrated circuit comprising:
   a lead frame having a first surface, a second opposing surface, and comprising a plurality of leads;
   a substrate having a first surface supporting a magnetic field sensing element and a second, opposing surface attached to the first surface of the lead frame, wherein the magnetic field sensing element is configured to generate a magnetic field signal indicative of movement of a target proximate to the integrated circuit;
   a magnet having a first surface and a second, opposing surface, and configured to generate a magnetic field;
   a spacer positioned between the first surface of the magnet and the second surface of the lead frame and having a thickness selected to establish a predetermined distance between the first surface of the magnet and the magnetic field sensing element, the predetermined distance selected to provide the magnetic field signal as a sinusoidal signal; and
   a non-conductive mold material enclosing the substrate, the spacer, and the magnet, such that at least a portion of at least one of the plurality of leads extends to an exterior surface of the non-conductive mold material.

2. The magnetic field sensor integrated circuit of claim 1, wherein the thickness of the spacer is further selected to provide the magnetic field signal with a predetermined minimum peak-to-peak signal level.

3. The magnetic field sensor integrated circuit of claim 2, wherein a ratio of the thickness of the spacer to a thickness of the magnet between the first surface of the magnet and the second surface of the magnet is selected to provide the magnetic field signal with the predetermined minimum peak-to-peak signal level and with less than a predetermined amount of deformation based at least in part on a nominal expected airgap distance between the magnetic field sensing element and the target and a size of the non-conductive mold material.

4. The magnetic field sensor integrated circuit of claim 1, wherein the spacer is comprised of a material having a magnetic permeability approximately equal to air.

5. The magnetic field sensor integrated circuit of claim 1, wherein the sinusoidal signal has less than a predetermined amount of deformation, wherein the predetermined amount of deformation is based on at least one of a level of harmonics in the magnetic field signal and a determination of an error curve as a difference between a nominal sinusoidal signal and the magnetic field signal.

6. The magnetic field sensor integrated circuit of claim 1, wherein the spacer has a thickness of approximately 2.4 millimeters.

7. The magnetic field sensor integrated circuit of claim 6, wherein the predetermined distance between the first surface of the magnet and the magnetic field sensing element is approximately 3.2 mm.

8. The magnetic field sensor integrated circuit of claim 1, wherein the spacer comprises at least one of a copper material or an aluminum material.

9. The magnetic field sensor integrated circuit of claim 1, further comprising a first attachment mechanism disposed between the spacer and the magnet.

10. The magnetic field sensor integrated circuit of claim 9, wherein the first attachment mechanism comprises one or more of a conductive or non-conductive adhesive, epoxy, tape, film or spray.

11. The magnetic field sensor integrated circuit of claim 9, further comprising a second attachment mechanism disposed between the spacer and the second surface of the lead frame.

12. The magnetic field sensor integrated circuit of claim 11, wherein the second attachment mechanism comprises one or more of a conductive or non-conductive adhesive, epoxy, tape, film or spray.

13. The magnetic field sensor integrated circuit of claim 11, further comprising a third attachment mechanism disposed between the second surface of the substrate and the first surface of the lead frame.

14. The magnetic field sensor integrated circuit of claim 13, wherein the third attachment mechanism comprises one or more of a conductive or non-conductive adhesive, epoxy, tape, film or spray.

15. The magnetic field sensor integrated circuit of claim 1, wherein the substrate comprises a semiconductor die.

16. The magnetic field sensor integrated circuit of claim 1, wherein the magnet comprises a sintered magnet or a ferromagnetic element or both.

17. A magnetic field sensor integrated circuit comprising:
   a lead frame having a first surface, a second opposing surface, and comprising a plurality of leads;
   a substrate having a first surface supporting a magnetic field sensing element and a second, opposing surface attached to the first surface of the lead frame, wherein the magnetic field sensing element is configured to generate a magnetic field signal indicative of movement of a target proximate to the integrated circuit;
   a magnet having a first surface and a second, opposing surface, and configured to generate a magnetic field, wherein the first surface of the magnet is disposed at a predetermined distance from the magnetic field sensing element, the predetermined distance selected to provide the magnetic field signal as a sinusoidal signal; and a non-conductive mold material enclosing the substrate and the magnet, such that at least a portion of at least one of the plurality of leads extends to an exterior surface of the non-conductive mold material; and a spacer disposed between the first surface of the magnet and the second surface of the lead frame and wherein the predetermined distance is established by a thickness of the spacer.

18. The magnetic field sensor integrated circuit of claim 17, wherein the predetermined distance is established by a thickness of the lead frame.

19. The magnetic field sensor integrated circuit of claim 17, wherein the sinusoidal signal has less than a predetermined amount of deformation.

20. A method of generating a magnetic field signal indicative of movement of a target, the method comprising:

attaching a substrate to a first surface of a lead frame comprising a plurality of leads, the substrate having a first surface supporting a magnetic field sensing element configured to generate the magnetic field signal indicative of movement of the target proximate to the magnetic field sensing element and a second, opposing surface attached to the first surface of the lead frame;

employing a magnet having a first surface and a second, opposing surface, and configured to generate a magnetic field;

positioning a spacer between the first surface of the magnet and the second surface of the lead frame and having a thickness selected to establish a predetermined distance between the first surface of the magnet and the magnetic field sensing element, the predetermined distance selected to provide the magnetic field signal as a sinusoidal signal; and employing a non-conductive mold material to enclose the substrate, the spacer, and the magnet, such that at least a portion of at least one of the plurality of leads extends to an exterior surface of the non-conductive mold material.

21. The method of claim 20, wherein the predetermined distance is selected to provide the magnetic field signal with a predetermined minimum peak-to-peak signal level.

22. The method of claim 20, wherein spacing comprises:
attaching a spacer to the magnet with a first attachment mechanism comprising one or more of a conductive or non-conductive adhesive, epoxy, tape, film or spray.

23. The method of claim 22, further comprising:
attaching the spacer to the second surface of the lead frame with a second attachment mechanism comprising one or more of a conductive or non-conductive adhesive, epoxy, tape, film or spray.

* * * * *

UNITED STATES PATENT AND TRADEMARK OFFICE
CERTIFICATE OF CORRECTION

PATENT NO. : 10,921,391 B2
APPLICATION NO. : 16/527319
DATED : February 16, 2021
INVENTOR(S) : Bryan Cadugan et al.

It is certified that error appears in the above-identified patent and that said Letters Patent is hereby corrected as shown below:

In the Specification

Column 16, Line 35, delete "Ai" and replace with --$A_1$--.

Column 18, Line 23, delete "the a" and replace with --$\delta R$--.

Signed and Sealed this
Tenth Day of May, 2022

Katherine Kelly Vidal
*Director of the United States Patent and Trademark Office*